United States Patent
Ogawa et al.

(10) Patent No.: US 6,803,324 B2
(45) Date of Patent: Oct. 12, 2004

(54) SEMICONDUCTOR DEVICE AND ITS MANUFACTURING METHOD

(75) Inventors: Tsuyoshi Ogawa, Kanagawa (JP); Yuji Nishitani, Kanagawa (JP); Akihiko Okubora, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/240,330

(22) PCT Filed: Jan. 31, 2002

(86) PCT No.: PCT/JP02/00797

§ 371 (c)(1),
(2), (4) Date: Mar. 6, 2003

(87) PCT Pub. No.: WO02/061827

PCT Pub. Date: Aug. 8, 2002

(65) Prior Publication Data

US 2003/0162386 A1 Aug. 28, 2003

(30) Foreign Application Priority Data

Jan. 31, 2001 (JP) ........................................ 2001-024688

(51) Int. Cl.[7] ...................... H01L 21/469; H01L 23/495
(52) U.S. Cl. ...................... 438/761; 438/107; 438/108; 438/109; 438/612; 438/615; 438/459; 438/462; 257/669; 257/676; 257/787; 257/723; 257/685; 257/778; 257/782
(58) Field of Search .................. 438/761, 107, 438/689, 673, 108, 109, 110, 459, 111, 612, 615, 462; 257/669, 676, 787, 723, 685, 686, 724, 778, 782

(56) References Cited

U.S. PATENT DOCUMENTS

| | | | | |
|---|---|---|---|---|
| 4,306,925 A | * | 12/1981 | Lebow et al. | 156/150 |
| 6,294,407 B1 | * | 9/2001 | Jacobs | 438/118 |
| 2002/0171157 A1 | * | 11/2002 | Soga et al. | 257/783 |

FOREIGN PATENT DOCUMENTS

| | | |
|---|---|---|
| JP | 06-318783 | 11/1994 |
| JP | 07-202427 | 8/1995 |

* cited by examiner

Primary Examiner—Matthew Smith
Assistant Examiner—Igwe U. Anya
(74) Attorney, Agent, or Firm—Sonnenschein, Nath & Rosenthal LLP

(57) ABSTRACT

A wiring circuit block is produced by forming a release layer on one of planarized principal surfaces of a mother substrate, forming an insulating layer on the release layer, patterning the insulating layer and forming a wiring layer on the patterned insulating layer, and separating the insulating layer and wiring layer from the release layer on the mother substrate. The circuit block has components, and deposited on the wiring layer, and is mounted on a base circuit board to provide a wiring device. Also, semiconductor chips are mounted on the circuit block, and the circuit block is mounted on a base circuit board to provide a semiconductor device.

15 Claims, 23 Drawing Sheets

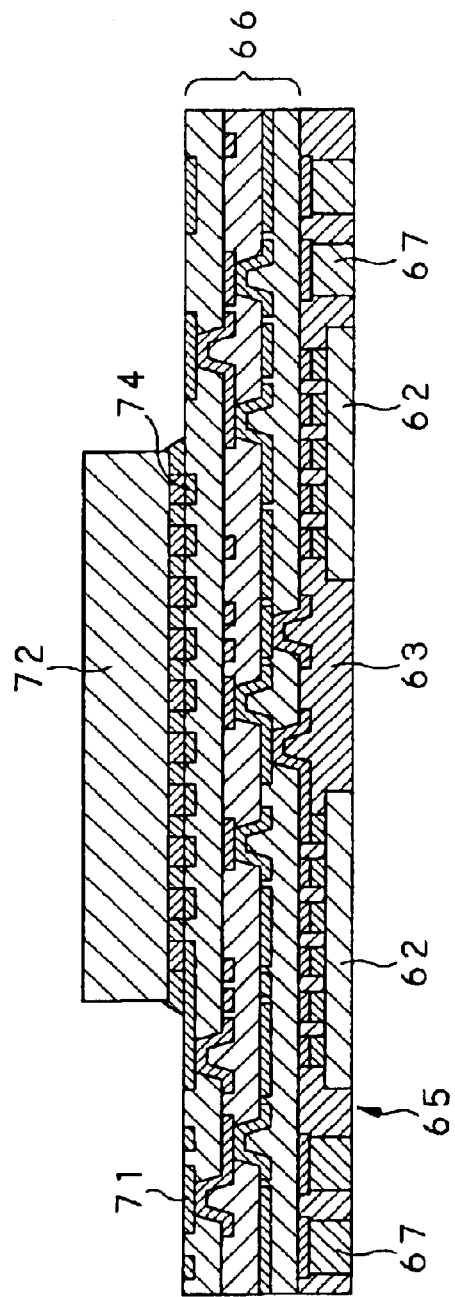
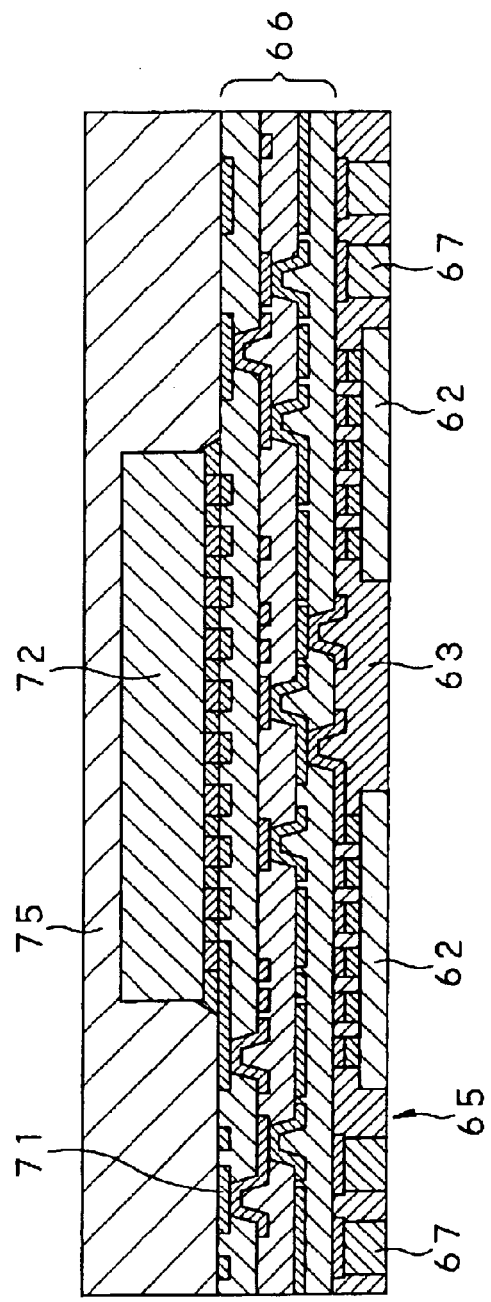
Fig.28A
Fig.28B

SEMICONDUCTOR DEVICE AND ITS MANUFACTURING METHOD

BACKGROUND OF THE INVENTION

The present invention relates to a thin circuit block and method of producing the thin circuit block, a thin wiring circuit device formed from the circuit blocks to have a thin, multilayer structure and method of producing the wiring circuit device, and a semiconductor device formed from the circuit block to have a thin, multilayer structure and method of producing the semiconductor device.

Recently, various electronic apparatuses are designed to be more compact and lightweight and have advanced or multiple functions. Also, a wiring circuit devices or semiconductor device, used in such electronic apparatuses, is designed to be smaller and more multilayer. The smaller, more multilayer structure of the wiring circuit device has been implemented by minimizing the via size and wiring pitch in a wiring circuit as well as by the technological developments such as smaller and multi-pin IC package, bare-chip mounting of semiconductor chips, minimization and surface mounting of passive components such as a capacitor, resistor, etc. With such a smaller structure of the wiring circuit device, however, it has become extremely difficult to produce and mount passive components on a circuit board in the wiring circuit device by such conventional techniques. Therefore, there has also been proposed a wiring circuit device having embedded therein components deposited directly on the principal surface, or in a layer, of a circuit board.

In the above wiring circuit device, the directly deposited components such as a resistor and capacitor are formed on a ceramic substrate by a thick film method in which pastes of metal and insulating material are printed by the screen printing, for example. However, the thick film method cannot implement any accurate pattern and thickness of the passive components and also it is not highly reliable upon because of its unstable repeatability etc. Also, since in the process of forming the passive components by the thick film method, pastes applied to a substrate are heated at a high temperature for sintering, so the substrate should have a high thermal resistance. Namely, the substrate can only be formed from limited kinds of material, which will lead to relatively high production costs.

On the other hand, the semiconductor device uses a so-called system large-scale integrated circuit (LSI) having predetermined functions integrated in one semiconductor chip. Also, with the evolution of the processing technique, a system LSI having integrated therein a mixture of different functions such as logical and memory functions or analog and digital functions, for example, has been provided for use as such a semiconductor device. Further, to meet the demands for the semiconductor device having a smaller, thinner structure, it has been proposed to attain such a reduced thickness by polishing a semiconductor yet in the state of a wafer, for example, at the back thereof by a mechanical or chemical method or by both.

Since the system LSI has a plurality of functional blocks formed therein through a plurality of processes corresponding to the functional blocks, so the number of processes will be larger, resulting in an increased time of production and a lower yield, which adds to production costs. To solve the problems of such a system LSI, it has also been proposed to adopt a multi-chip module (MCM), for example, in lieu of the system LSI. The MCM is a semiconductor module formed by producing the above functional blocks as individual semiconductor chips in their respective processes and mounting the semiconductor chips together on the same wiring board, and which has similar functions to those of the system LSI.

To solve the aforementioned problems of the wiring circuit device, it has been proposed to provide a wiring circuit device having components embedded therein by any one of the thin film methods such as photolithography, sputtering, evaporation and the like as shown in FIGS. 29 and 30. FIG. 29 shows a wiring circuit device 100 having an insulating layer 102 formed on the principal surface of a core substrate 101, and a wiring pattern 103 and resistor 104 deposited on the insulating layer 102. The resistor 104 is formed from nickel-chrome (Ni—Cr), tantalum nitride (TaN) or tantalum (Ta) for example. It should be noted that the tantalum nitride is preferably usable to form the resistor 104 because its temperature coefficient (TCR) is as small as below 100 ppm/° C. and life is stably long.

FIG. 30 shows another wiring circuit device 105 including the core layer 101 having the insulating layer 102 formed on the principal surface thereof and the wiring pattern 103 formed on the insulating layer 102, as in the aforementioned wiring circuit device 100. The wiring circuit board 105 further includes a capacitor 106 deposited between end portions 103a and 103b of the wiring pattern 103. More specifically, the capacitor 106 includes the lower wiring pattern 103a (end portion of the wiring pattern 103), a dielectric layer 107 deposited on the lower wiring pattern 103a, and the upper wiring pattern 103b (end portion of the wiring pattern 103) stacked on the dielectric layer 107. The dielectric layer 107 is formed from tantalum oxide ($Ta_2O_5$), silicon nitride ($Si_3N_4$), barium titanate (BaTiO) or the like. Tantalum oxide can be deposited directly on the substrate by sputtering. A tantalum oxide layer having a desired thickness can be formed by anodic oxidation of the tantalum layer and tantalum nitride layer and making the oxide grow on the surface of the substrate.

The core substrate of the wiring circuit device is formed from a conductive silicon substrate which will function when a passive component is formed on the substrate. To connect, by the wire bonding technique, multiple lands formed on the wiring pattern to lands, respectively, on a mother substrate when mounting the wiring circuit device on a mother substrate, a terminal pattern is formed on the surface of a layer in which a passive component is to be formed. Therefore, the wiring circuit device has to undergo processes of the terminal pattern forming and wire bonding.

A communication terminal unit or the like should essentially be compact and lightweight for portability, and so it includes a radio frequency (RF) module provided in a transmission/reception unit thereof to convert analog RF signals. FIG. 31 illustrates an example of the RF module. The RF module is generally indicated with a reference 110. As shown, the RF module 110 includes a base circuit board 111, and an RF device layer 112 stacked on the base circuit board 111 and in which passive components are formed by deposition by the thin film and thick film methods. The RF device layer 112 has a first wiring layer 115 formed on a wiring pattern 113 on the base circuit board 111 with an insulating layer 114 provided between the wiring pattern 113 and the layer 115. In the RF device layer 112, the wiring pattern 113 on the base circuit board 111 is connected to the first wiring layer 115 by a via 116 formed in the insulating layer 114.

The passive components formed in the RF device layer 112 include a resistor 117 and capacitor 118 deposited on the first wiring layer 115. Further, the RF device layer 112 includes a second insulating layer 119 formed on the first wiring layer 115, and a second wiring layer 120 stacked on the second insulating layer 119 with a via 116 being formed in the latter. In the RF device layer 112, the second wiring layer 120 has an inductor 121 formed thereon. It should be noted that the inductor 121 is generally formed not by any thin film method such as sputtering because of a gain loss, but by a thick film method such as plating for example.

Since in such an RF transmission/reception module (will be referred to as "RF module" hereunder) 110, the resistor 117 and capacitor 118 are formed with a high precision on the base circuit board 111 by the thin film method such as sputtering, so the base circuit board 111 is required to be highly resistant against an elevated surface temperature during sputtering, and able to well keep a focal depth during lithography and also a contact alignment during masking. To this end, the base circuit board 111 is also required to be high-precision planarized and have a high performance of insulation and a high thermal or chemical resistance.

In the RF module 110, the core substrate of the base circuit board 111 is formed from silicon (Si) or glass having the above characteristics, and so low-loss passive components can be deposited on the core substrate at lower costs independently of the LSI producing process. Use of the Si or glass substrate to form the core substrate in the RF module 110 permits to form the passive components with a higher precision and make the areas of such components about 100 times smaller than by the patterning by printing used in the conventional ceramic module processing or by the wet etching used to form a wiring pattern on a printed wiring board. Also, use of the Si or glass substrate as the core substrate in the RF module 110 permits the deposited passive components to operate with a frequency of up to 20 GHz.

For the above RF module 110, however, it is necessary to form lands on the RF device layer 112 and connect them by the wire bonding technique or the like as having been described above in order to mount the RF module 110 on a mother substrate, for example. Namely, in the RF module 110, power and ground lines or control signal lines from the base circuit board 111 are connected to the RF device layer 112 in which an RF signal wiring pattern is formed. Thus in the RF module 110, an electromagnetic interference will take place between the base circuit board 111 and RF device layer 112, and multiple wiring layers are to be formed, which will lead to larger production costs.

For forming an RF module, an organic wiring board generally used in conventional wiring board devices and which are relative inexpensive and can be multilayered is used to solve the problems caused by the aforementioned silicon or glass substrate. In the RF module thus formed from the organic wiring board, power and ground lines and control signal lines are formed on the base circuit board and an RF signal circuit is formed in the RF device layer, to thereby separate the base circuit board and RF device layer from each other. Thus, it is possible to inhibit the electromagnetic interference from taking place and thus improve the characteristics of the RF module. Since power and ground lines having sufficient area can be formed on the base circuit board, a power can be supplied to the RF module with a high regulation.

However, the RF module is disadvantageous in that in case the RF device layer is formed on a multilayer wiring board as a base circuit board, no high-precision deposited passive components can be formed because the base circuit board does not show any sufficient characteristics of the aforementioned silicon or glass substrate. Also, since the multilayer wiring board itself shows a warping, so the precision of aligning a wring pattern of each layer with a one of the other layer becomes lower in a sequence of patterning processes, so that the RF module cannot be produced with a high precision. Further, the RF module is disadvantageous in that since the multilayer wiring board has a relatively hard surface which is rather irregular due to the wiring pattern formed therein, so it is difficult to form high-precision deposited passive components having to be planar. Moreover, it is difficult to subject the RF module to sputtering because the multilayer wiring board is no sufficient thermal resistance.

FIG. 32 shows a semiconductor device. The semiconductor device is generally indicated with a reference 130. As shown, the semiconductor device 130 includes a wiring board 131 formed from an organic or ceramic substrate, and wiring layers 134 and 135 formed by patterning on the front and rear principal surfaces of the wiring board 131 with insulating layers 132 and 133 being provided under the wiring layer 134 and on the wiring layer 135, respectively. In this semiconductor device 130, appropriate wiring patterns and deposited components (as necessary) (not shown) are formed in the wiring layers 134 and 135 one of which has semiconductor chips 136 mounted with their face down on one of the principal surfaces thereof. In the semiconductor device 130, the front and rear wiring layers 134 and 135 are connected to each other via through-holes 137 formed in the wiring board 131. In the semiconductor device 130, solder resist layers 138 and 139 are formed over the wiring layer 134 and below the wiring layer 135, respectively, and connecting terminals 142 and external-connection electrodes 143 are formed and connected to the wiring layers 134 and 135 by via-holes 140 and 141, respectively.

Since in the semiconductor device 130, wiring paths are formed on the principal surface of the wiring board 131 at a pitch of about 100 μm at minimum, so the wiring board 131 should have a wide area or be multilayered in case many connections are to be made between the semiconductor chips 136. Also, in the semiconductor device 130, the semiconductor chips 136 or wiring patterns are connected to each other via the through-holes 137 in case the semiconductor chips 136 are mounted on each of the front and rear principal surfaces of the wiring board 131. In the semiconductor device 130, the wiring board 131 should have a large area because the through-holes 137 and lands have a diameter of at least about 50 μm.

In the semiconductor device 130, because of the aforementioned problems caused by the wiring board 131, the wiring path connecting the semiconductor chips 136 to each other will be longer and the wiring pass will include a larger number of vias 140 and 141 as more wiring layers are formed. Therefore, the semiconductor device 130 will have larger components L, C and R of the wiring path and its performance will be lower than that of a system LSI.

Also, in the semiconductor device 130, no semiconductor chips and other electronic parts can be mounted on the back of the wiring board 131 because there are formed there the external-connection terminals 143 as mentioned above for use to mount the semiconductor device 130 on a mother substrate. Thus the semiconductor device 130 is disadvantageous in that the semiconductor chip 136 cannot well be related with its peripheral circuits and components cannot be mounted to the wiring board 131 with a high density.

On the other hand, the semiconductor chip 136 formed from a wafer having been polished for a reduced thickness may be mounted on the wiring board 131 in the semiconductor device 130. However, such a thin semiconductor chip 136 has no sufficient mechanical strength, so it is not easy to handle after the polishing process. For example, the wafer may possibly be broken during transportation to a next process or cracked in the dicing process. Also, the thin semiconductor chip 136 will possibly be chipped or cracked while it is being mounted on the wiring board 131.

The aforementioned use of the silicon or glass substrate excellent in flatness and thermal resistance as mentioned above is intended to attain an improved reliability of the wiring layers in the semiconductor device 130. However, since it is difficult to form conductive structures on both the front and back sides of the semiconductor device 130, a higher packaging density cannot easily be attained by mounting semiconductor chips on both the sides of the semiconductor device 130. Also, in the semiconductor device 130, the wiring board 131 is likely to warp due to a difference in wiring density from one wiring layer to another. Especially, heat caused in the process of mounting the semiconductor chips 136 will further increase the warping of the wiring board 131, if formed from an organic substrate, so that poor soldering may possibly result during mounting of the semiconductor device 130 on a mother substrate for example, which will cause the reliability of the wiring layers to be lower.

SUMMARY OF THE INVENTION

Accordingly, the present invention has an object to overcome the above-mentioned drawbacks of the related art by providing a thin circuit block formed by selecting a silicon or glass substrate having a sufficient flatness and less warping as a mother substrate, subjecting the mother substrate to thin and thick film deposition processes, forming, on the mother substrate, wiring layers having embedded deposited components therein on contact with insulating layers, respectively, and then separating the thus formed circuit block from the mother substrate, the circuit block being a high-precision, high-functional and highly reliable one intended for use to provide a compact and inexpensive package, and method of producing the circuit block, a wiring circuit device including the circuit block and method of producing the wiring circuit device, and a semiconductor device including the circuit block and method of producing the semiconductor device.

The above object can be attained by providing a sheet-like circuit block including according to the present invention:
   a patterned insulating layer;
   a wiring layer formed inside the patterned insulating layer; and
   a plurality of external-connecting lands formed on the wiring layer;
   the circuit block thus constructed being formed on a release layer formed on a planarized principal surface of a mother substrate and at which it is separated from the mother substrate.

Since the circuit block according to the present invention is produced on a mother substrate having a high-precision planarized surface and an excellent thermal resistance and chemical resistance, capable of well keeping a focal depth during lithography and showing a good contact alignment during masking, so the wiring layer thus formed in the circuit block can include fine wiring passes and so high a precision and reliability as permitting to embed high-precision deposited components therein and mount semiconductor chips, electronic parts, etc., with a high density without being influenced by any warping and surface irregularities of the substrate. This circuit block is bonded to a base circuit board or the like to provide a highly reliable wiring circuit device.

Also, the above object can be attained by providing a circuit block producing method including, according to the present invention, steps of:
   forming a release layer on a planarized principal surface of a mother substrate;
   forming an insulating layer on the release layer;
   patterning, on the insulating layer, a wiring layer having a plurality of external-connection lands; and
   separating, from the release layer on the mother substrate, a thin circuit block consisting of the insulating layer and wiring layer.

In the above method according to the present invention, the circuit block is produced on a mother substrate having a high-precision planarized surface and an excellent thermal resistance and chemical resistance, capable of well keeping a focal depth during lithography and showing a good contact alignment during masking. So, the circuit block can efficiently be produced to include the wiring layer having fine wiring passes and so high a precision and reliability as permitting to embed high-precision deposited components therein and mount semiconductor chips, electronic parts, etc. with a high density, without being influenced by any warping and surface irregularities of the substrate.

Also, the above object can be attained by providing a wiring circuit device including according to the present invention:
   a circuit block; and
   a base circuit board having a plurality of connection lands formed on a principal surface thereon correspondingly to external-connection lands formed on the circuit block;
   the circuit block being shaped as a sheet including:
      an insulating layer;
      a wiring layer patterned on the insulating layer; and
      the plurality of external-connection lands formed on the wiring layer;
   the circuit block being formed on a release layer formed on a planarized principal surface of a mother substrate;
   the circuit block being separated from the release layer on the mother substrate; and
   the circuit block being bonded to the principal surface of the base circuit board with the external-connection lands formed on the wiring layer being connected to the corresponding connection lands formed on the base circuit board.

The above wiring circuit device includes the circuit block produced on a mother substrate having a high-precision planarized surface and an excellent thermal resistance and chemical resistance, capable of well keeping a focal depth during lithography and showing a good contact alignment during masking, and which includes the wiring layer having fine wiring passes and so high a precision and reliability as permitting to embed high-precision deposited components therein and mount semiconductor chips, electronic parts, etc. with a high density, without being influenced by any warping and surface irregularities of the substrate. Since the wiring layer and circuit of the base circuit board are isolated from each other electrically and electromagnetically to prevent any mutual interference from taking place, so it has improved characteristics. Also, since power and ground lines having sufficient areas can be formed on the base circuit board, a power can be supplied to the wiring circuit device with a high regulation.

Also, the above object can be attained by providing a method of producing a wiring circuit device, including, according to the present invention, steps of:

forming a circuit block on a mother substrate; and mounting, by bonding, the circuit block on a principal surface of a base circuit board;

the circuit block forming step further including steps of:

forming a release layer on a planarized principal surface of a mother substrate;

forming an insulating layer on the release layer;

patterning, on the insulating layer, a wiring layer with a plurality of external-connection lands; and separating, from the release layer on the mother substrate, a thin circuit block consisting of the insulating layer and wiring layer.

In the above wiring circuit device producing method, the circuit block is produced on a mother substrate having a high-precision planarized surface and an excellent thermal resistance and chemical resistance, capable of well keeping a focal depth during lithography and showing a good contact alignment during masking, and mounted, by bonding, on a base circuit board. The wiring circuit device thus produced includes a wiring layer having fine wiring passes and so high a precision and reliability as permitting to embed high-precision deposited components therein and mount semiconductor chips, electronic parts, etc. with a high density, without being influenced by any warping and surface irregularities of the substrate. Since the wiring layer and circuit of the base circuit board are isolated from each other electrically and electromagnetically to prevent any mutual interference from taking place, so it has improved characteristics. Also, since power and ground lines having sufficient areas can be formed on the base circuit board, a power can be supplied to the wiring circuit device with a high regulation.

Also, the above object can be attained by providing a semiconductor device including according to the present invention:

a circuit block shaped in the form of a sheet;

semiconductor chips mounted on a wiring layer of the circuit block and a sealing resin layer which seals the semiconductor chips; and a base circuit board having formed on a principal surface thereof a plurality of connection lands corresponding to external-connection lands of the circuit block;

the circuit block including:

an insulating layer;

a wiring layer patterned on the insulating layer; and the plurality of external-connection lands formed on the wiring layer.

The above semiconductor device includes the circuit block produced on a mother substrate having a high-precision planarized surface and an excellent thermal resistance and chemical resistance, capable of well keeping a focal depth during lithography and showing a good contact alignment during masking, and which has fine wiring passes. Thus, semiconductor chips can be mounted on the semiconductor device with a high precision without being influenced by any warping and surface irregularities of the base circuit board. Since the wiring layer and circuit of the base circuit board are isolated from each other electrically and electromagnetically to prevent any mutual interference from taking place, so it has improved characteristics. Also, since power and ground lines having sufficient areas can be formed on the base circuit board, a power can be supplied to the semiconductor device with a high regulation. In this semiconductor device, the semiconductor chips and sealing resin layer are reduced in thickness by polishing and incurs less fracture, crack or the like.

Also, the above object can be attained by providing a semiconductor device producing method including, according to the present invention, steps of:

forming a thin circuit block on a mother substrate;

mounting semiconductor chips on the circuit block;

forming, on a wiring layer of the circuit block, a sealing resin layer which seals the semiconductor chips;

separating the circuit block having the semiconductor chips mounted thereon from a release layer formed on the mother substrate; and mounting, by bonding, the circuit block on a principal surface of a base circuit board; and the circuit block forming step including steps of:

forming the release layer on a planarized principal surface of the mother substrate;

forming an insulating layer on the release layer; and patterning, on the insulating layer, the wiring layer having a plurality of external-connection lands.

In the above semiconductor device producing method, the circuit block is produced on the mother substrate having a high-precision planarized surface and an excellent thermal resistance and chemical resistance, capable of well keeping a focal depth during lithography and showing a good contact alignment during masking, and mounted, by bonding, on the base circuit board. Thus, the semiconductor device can efficiently be produced and it is highly reliable since it has formed therein fine wiring passes not affectable by warping and surface irregularities of the base circuit board and can have semiconductor chips mounted thereon with a high precision. Since the wiring layer and circuit of the base circuit board are isolated from each other electrically and electromagnetically to prevent any mutual interference from taking place, so it has improved characteristics. Also, since power and ground lines having sufficient areas can be formed on the base circuit board, a power can be supplied to the semiconductor device with a high regulation. In this semiconductor device, the semiconductor chips and sealing resin layer are reduced in thickness by polishing and incurs less fracture, crack or the like.

These objects and other objects, features and advantages of the present invention will become more apparent from the following detailed description of the best mode for carrying out the present invention when taken in conjunction with the accompanying drawings.

BRIEF DESCRIPTION OF THE DRAWINGS

FIGS. 20A to 20D are axial sectional views showing the process of producing a circuit block with the use of a mother substrate having a dummy layer provided thereon, in which FIG. 20A is an axial sectional view showing the process of cutting the circuit block assembly into circuit blocks; FIG. 20B is an axial sectional view showing the process of separating the circuit blocks from the mother substrate; FIG. 20C is an axial sectional view of the mother substrate after undergoing the cutting process as shown in FIG. 20B; and FIG. 20D is an axial sectional view of the mother substrate from which the resin layer has been removed.

FIGS. 28A and 28B are axial sectional views showing the processes of producing the semiconductor module according to the present invention.

DETAILED DESCRIPTION OF THE PRESENTLY PREFERRED EMBODIMENTS

The embodiments of the present invention will be described herebelow with reference to the accompanying drawings.

A circuit block according to the present invention is indicated with a reference 2. The circuit block 2 is to be mounted on a radio frequency (RF) module 4 provided in a portable communication terminal unit or the like to convert analog RF signals in a transmission/reception block thereof by the super heterodyne method or direct conversion method.

Figure 1:
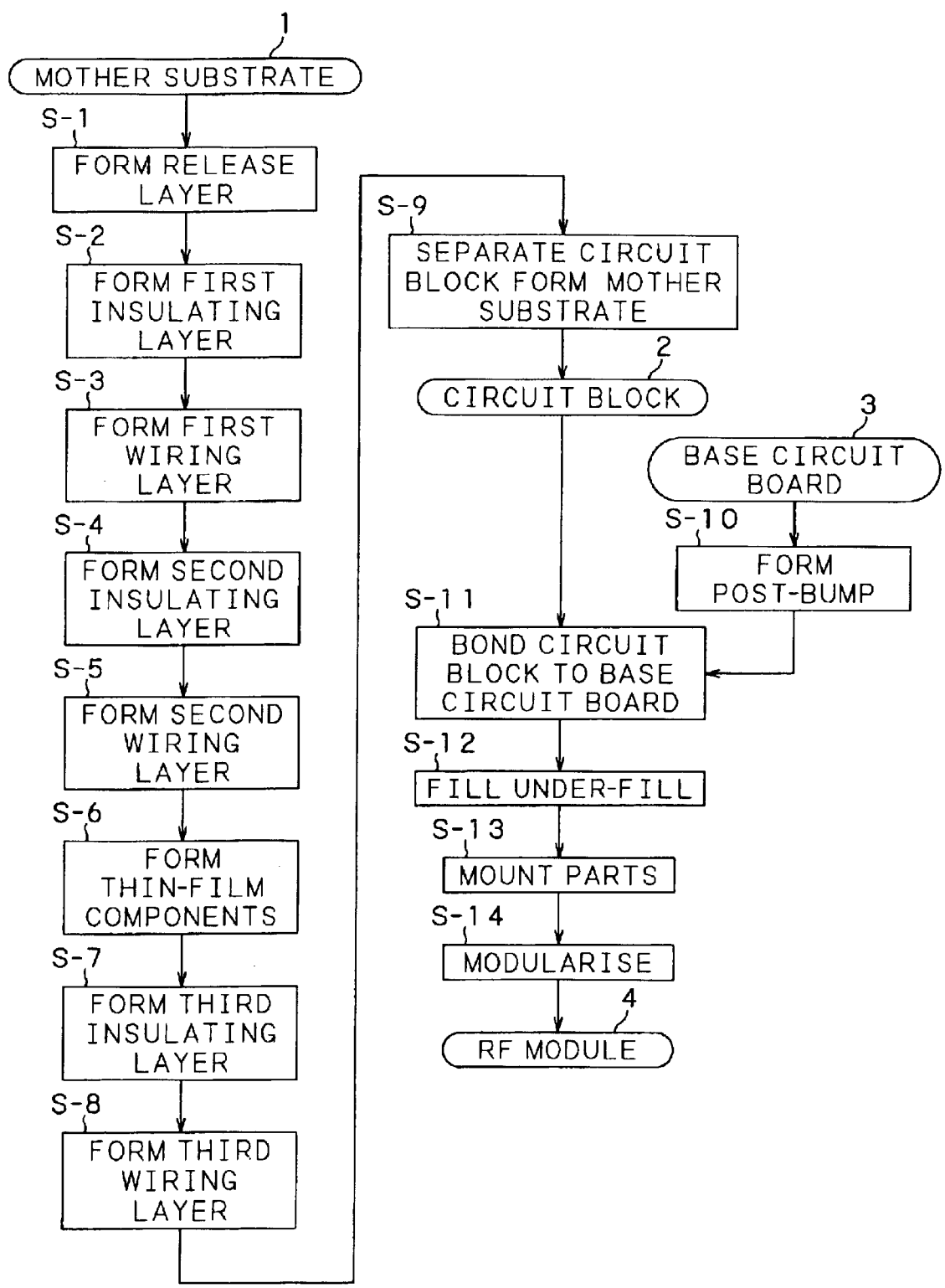
FIG. 1 shows a flow of processes of producing the radio frequency (RF) module according to the present invention.

As shown in the production process chart in FIG. 1, the circuit block 2 according to the present invention is formed on a mother substrate 1, separated from the mother substrate 1 in the separation process, and bonded to a base circuit board 3 formed from a multilayer wiring board to provide the RF module 4. In the RF module 4, the base circuit board 3 forms a layer where there are formed power system lines and control system lines to the circuit block 2 overlaid on the base circuit board 3 or a ground layer.

Figure 2:
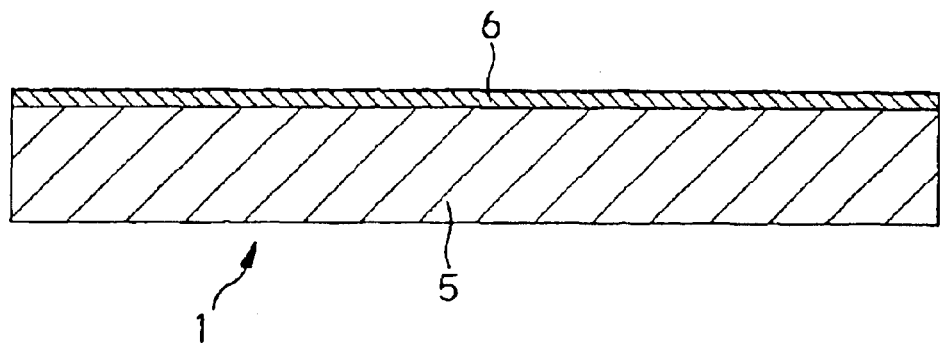
FIG. 2 is an axial sectional view of a mother substrate used in production of the RF module according to the present invention.

For producing the RF module 4, the mother substrate 1 as shown in FIG. 2 is prepared. The mother substrate 1 is formed from a highly rigid silicon (Si) or glass substrate having a high insulation performance and a thermal or chemical resistance, and which can be shaped to have a high-precision planarized surface. On the principal surface of the mother substrate 1, there is formed the circuit block 2 through various production processes.

Use of the above-mentioned mother substrate 1 in the circuit block producing method according to the present invention is intended to assure resistance against an elevated surface temperature during sputtering, keeping a pattern during lithography and an improved contact alignment during masking. The circuit block 2 produced by the RF module producing method according to the present invention has an area about 100 times smaller than that of a conventional one produced by printing or wet etching, and can operate with a frequency of up to 20 GHz.

According to the present invention, the mother substrate 1 includes a base material 5 formed from Si or glass. The method of producing the RF module 4 includes a first step S-1, as in FIG. 1, in which a release layer 6 is formed, by deposition, on one of the principal surfaces of the base material 5. This step will be explained with reference to FIG. 2. The principal surfaces have a surface planarized with a high precision. The release layer 6 is formed, by deposition, from copper or aluminum by an appropriate thin film method. More specifically, the release layer 6 is formed from copper or aluminum by sputtering on the principal surface of the base material 5 to have a uniform thickness of about 1000 Å over the principal surface. On the surface of the metal layer thus formed on the release layer 6, there is formed a resin (for example, polyimide) layer of 1 to 2 μm in thickness by spin coating. The mother substrate 1 will has formed on the principal surface thereof a circuit block 2 including a plurality of stacked layers as will be described later, while the release layer 6 will work for separation of the circuit block 2 in the separation step which will be described in detail later.

Figure 3:
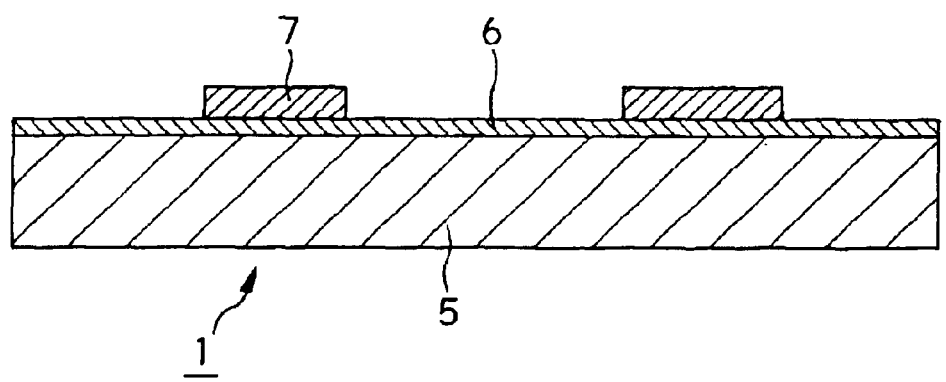
FIG. 3 is an axial sectional view of the mother substrate shown in FIG. 2 and having a first insulating layer formed thereon.

According to the present invention, the method of producing the RF module 4 further includes a second step S-2, as in FIG. 1, in which a first insulating layer 7 is formed, by deposition, on the release layer 6 of the mother substrate 1. This step will be explained with reference to FIG. 3. The first insulating layer 7 is formed from a dielectric material with a low dielectric constant, low Tan δ, namely, an excellent RF characteristic, and a high thermal or chemical resistance. The dielectric material may be for example a polyimide, benzocyclobutene (BCB), polynorbornen (PNB), liquid crystal polymer (LCP), epoxy or acryl resin. As shown, the first insulating layer 7 is formed as a predetermine pattern on the release layer 6 by an appropriate thin film method. When a photosensitive dielectric material is used, the first insulating layer 7 is formed as a pattern directly on the release layer 6 by the photolithography. When a non-photosensitive dielectric material is used, the first insulating layer 7 is formed as a pattern on the release layer 6 by the photolithography and dry etching for example.

Figure 4:
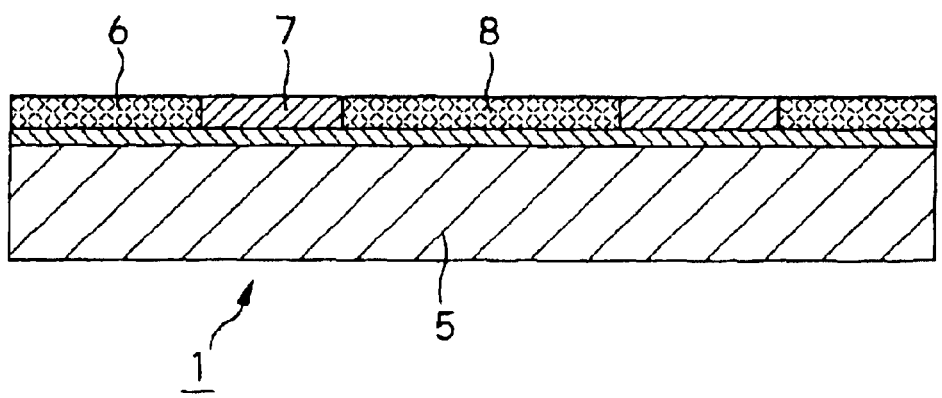
FIG. 4 is an axial sectional view of the mother substrate shown in FIG. 3 having a first wiring layer additionally formed thereon.

The RF module producing method according to the present invention further includes a third step S-3, as in FIG. 1, in which a first wiring layer 8 is formed, by deposition on the release layer 6, from a metal plating correspondingly to an opening in the first insulating layer 7 formed as the pattern by plating the mother substrate 1, for example. This step will be explained with reference to FIG. 4. In this step, the first wiring layer 8 is shaped to have generally the same thickness as the first insulating layer 7 by coating an exposed portion of the release layer 6, corresponding to the opening in the first insulating layer 7, with copper, for example, with the release layer 6 being used as a voltage-applied terminal.

The boundaries of the first insulating layer 7 and first wiring layer 8 with the release layer 6 provide a surface at which the circuit block 2 is released or separated from the mother substrate 1. Since in this first wiring layer forming step, the first wiring layer 8 is formed from the copper plating by the thick film method, so the release surface can be shaped as a high-precision planarized surface and the circuit block 2 can stably be bonded to the base circuit board 3 as will be described later. The first wiring layer should 8 should preferably be shaped to have a sufficient thickness because it is to be formed as ground and power lines in the circuit block 2. So, it should preferably be formed from a plating by the thick film method.

The first wiring layer 8 is formed, by deposition, directly on the release layer 6 from the copper plating. However, it should be noted that the first wiring layer 8 may be formed on a primary layer of gold-nickel preformed on the release layer 6, for example. In the first wiring layer 8, the primary layer will effectively work as connection terminals on contact with lands, solder bumps, etc. formed on the base circuit board 3 as will be described later.

The first wiring layer 8 and first insulating layer 7 may be formed by forming a metal layer from gold-nickel-copper for example on the release layer 6 by plating, sputtering or the like and then etching the thus applied metal layer to form a wiring pattern while forming an insulating layer, for example. Also, these layers 8 and 7 may be formed by the adaptive method or the like in which a plating resist layer is formed on the release layer 6 and the plating is used to form a predetermined wiring pattern, for example.

Figure 5:
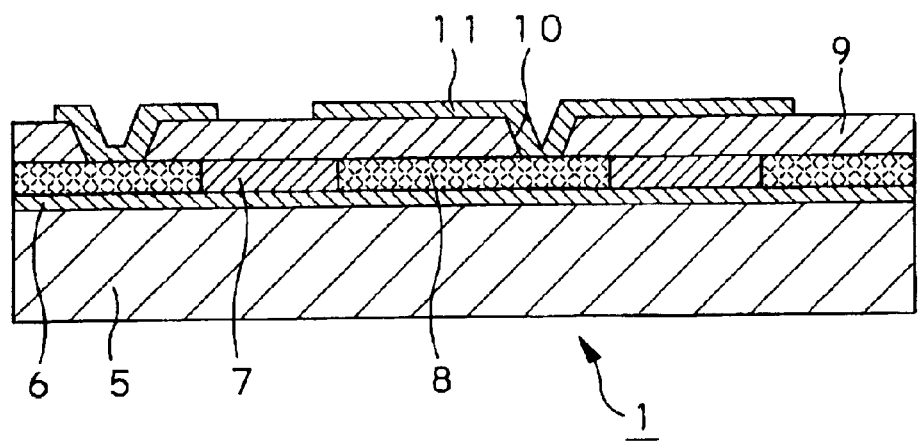
FIG. 5 is an axial sectional view of the mother substrate shown in FIG. 4 and having second insulating and wiring layers additionally formed thereon.

The RF module producing method according to the present invention further includes a fourth step S-4, as in FIG. 1, in which a second insulating layer 9 is formed over the first insulating layer 7 and first wiring layer 8. This step will be explained with reference to FIG. 5. The second insulating layer 9 is formed from the same dielectric material as that of the aforementioned first insulating layer 7. In this second insulating layer forming step, a plurality of vias 10 is formed in the second insulating layer 9 for the first wiring layer 8 to be exposed at predetermined portions thereof. In case the second insulating layer 9 is to be formed from a photosensitive dielectric material, each of the vias 10 is directly formed by photolithography with a mask having a predetermined pattern formed thereon being attached to the surface of the second insulating layer 9. Each via 10 may be formed by any appropriate method, for example, by irradiating the second insulating layer 9 with a laser light.

The RF module producing method according to the present invention further includes a fifth step S-5, as in FIG. 1, in which a second wiring layer 11 is formed by forming an appropriate wiring pattern on the second insulating layer 9. This step will also be explained with reference to FIG. 5. The second wiring layer 11 is formed by the aforementioned thin film method such as copper plating or sputtering, and connected by each via 10 to the first wiring layer 8. The second wiring layer 11 is stacked on each layer formed on the planar principal surface of the mother substrate 1. The second wiring layer 11 formed in this second wiring layer forming step is of a very high precision as compared with the conventional multilayer printed wiring board having many wiring layers formed by stacking on an organic material as a base substrate.

Figure 6:
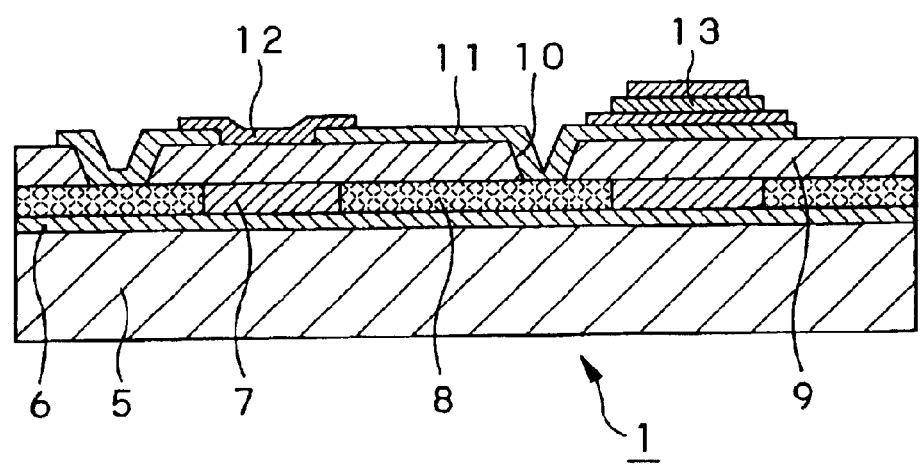
FIG. 6 is an axial sectional view of the mother substrate shown in FIG. 5 and having a thin-film resistor and thin-film capacitor additionally formed on the second wiring layer.

The RF module producing method according to the present invention further includes a sixth step S-6, as in FIG. 1, in which thin-film components such as a thin-film resistor 12 and thin-film capacitor 13 are formed on the second wiring layer 11. This step will be explained with reference to FIG. 6.

Note that in this thin-film component forming step S-6, an inductor which will be described later may be formed on the second wiring layer 11.

The thin-film resistor 12 is formed by deposition, by the photolithography, sputtering, evaporation or the like (thin film method) as having been described above, of a resistor material such as nickel-chromium, tantalum nitride or tantalum on a portion of the second wiring layer 11, where the resistor 12 is to be formed. For forming the thin-film resistor 12, a tantalum nitride layer is formed, by the lift-off technique, on the portion of the second insulating layer 9, on which the resistor 12 is to be formed, the tantalum nitride layer is coated with a resist layer and then tantalum nitride is sputtered, and the tantalum nitride is removed from the resist layer, for example.

To form the thin-film capacitor 13, the entire surface of the second wiring layer 11 except from a portion thereof, where the capacitor 13 is to be formed, is coated with a resist, an electric field is applied in an electrolyte such as ammonium borate for the tantalum nitride to serve as a positive electrode (anodizing process), and then an upper electrode is formed. In the anodizing process, the tantalum nitride is applied with a voltage of 100 V for 30 min so that the tantalum oxide layer oxidized to provide a tantalum oxide layer. The second wiring layer 11 has the resist there patterned by photolithography to leave only a necessary wiring pattern, the tantalum oxide layer is masked after removal of the resist, and the upper electrode consisting of a nickel layer and copper layer is formed by the lift-off technique for example.

The mother substrate 1 used in the RF module producing method according to the present invention has the high-precision planarized surface and an excellent thermal resistance and chemical resistance, can well keep a focal depth during lithography and shows a good contact alignment during masking. Since the mother substrate 1 will not be influenced by the heat developed during sputtering and etchant in the thin-film component forming step, so the thin-film resistor 12 and capacitor 13 can be formed with a high precision on the second wiring layer 11.

Figure 7:
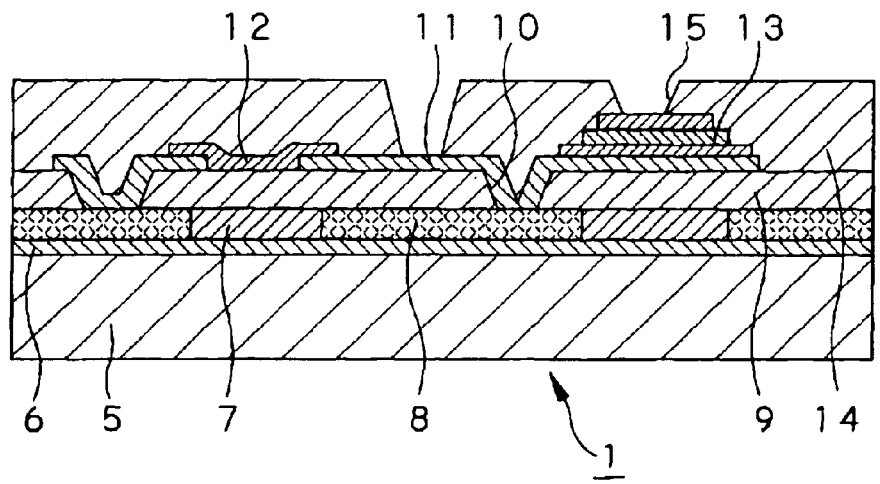
FIG. 7 is an axial sectional view of the mother substrate shown in FIG. 6 and having a third insulating layer additionally formed thereon.

The RF module producing method according to the present invention further includes a seventh step S-7, as in FIG. 1, in which a third insulating layer 14 is formed over the second wiring layer 11, thin-film resistor 12 and thin-film capacitor 13 to cover the latter. This step will be explained with reference to FIG. 7. The third insulating layer 14 is also formed from the same dielectric material as those for the first and second insulating layers 7 and 9. Also in this third insulating layer forming step, a plurality of vias 15 is formed through which there are exposed a predetermined portion of the second wiring layer 11 and the upper electrode of the thin-film capacitor 13. The vias 15 are formed by photolithography with a mask having a predetermined pattern formed thereon being attached to the surface of the third insulating layer 14 similarly to the aforementioned vias 10 formed in the second insulating layer 9.

Figure 8:
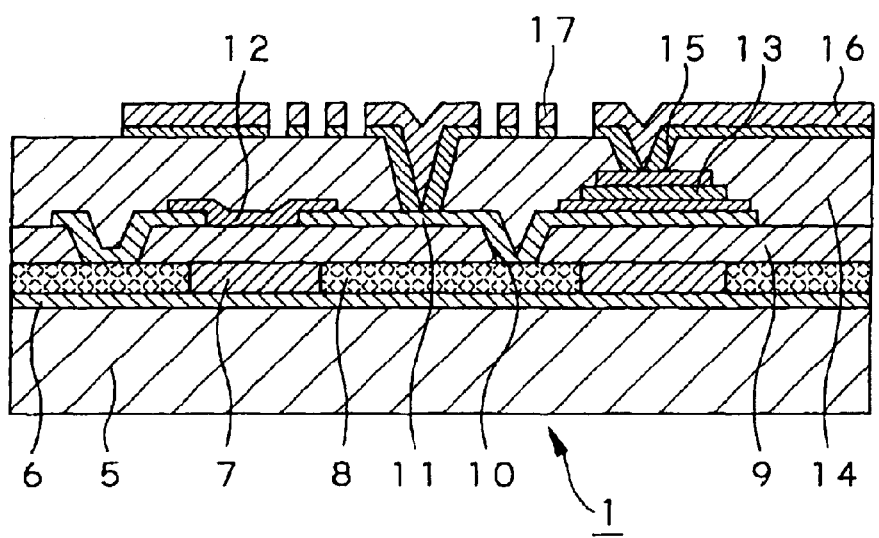
FIG. 8 is an axial sectional view of the mother substrate shown in FIG. 7 and having a third wiring layer additionally formed thereon.

The RF module producing method according to the present invention further includes an eighth step S-8, as in FIG. 1, in which a third wiring layer 16 is formed on the third insulating layer 14. This step will be explained with reference to FIG. 8. The third wiring layer 16 is formed by forming a copper wiring pattern by the thin film method such as sputtering or by the thick film method such as copper plating. To form this third wiring layer 16, a sputter layer formed from nickel and copper is formed on the second insulating layer 9 by sputtering or the like and then the sputter layer undergoes a predetermined patterning by photolithography. After the sputter layer thus pattern is selectively given electrolytic-copper plating of several μm in thickness, the solder resist is removed and then the entire sputter layer is etched, thereby forming the third wiring layer 16 as shown.

The third wiring layer 16 is electrically connected to the second wiring layer 11 and thin-film capacitor 13 by sputter layers formed on the inner walls of the vias 15. As shown, a spiral inductor 17 is formed in a part of the third wiring layer 16. To solve the problem of series resistance of the inductor 17, the above-mentioned electrolytic-copper plating of the predetermined thickness is given to the sputter layer on the third wiring layer 16 to prevent resistance loss. It should be noted that for example the above-mentioned thin-film resistor 12 and thin-film capacitor 13 may of course be formed on the third wiring layer 16 as well.

At this stage, the circuit block 2 of a stacked structure is formed on the mother substrate 1 with the third wiring layer 16 being positioned as the uppermost layer. It should be noted that according to the present invention, further insulating layers and wiring layers may be formed on the third wiring layer 16 as necessary.

Figure 9:
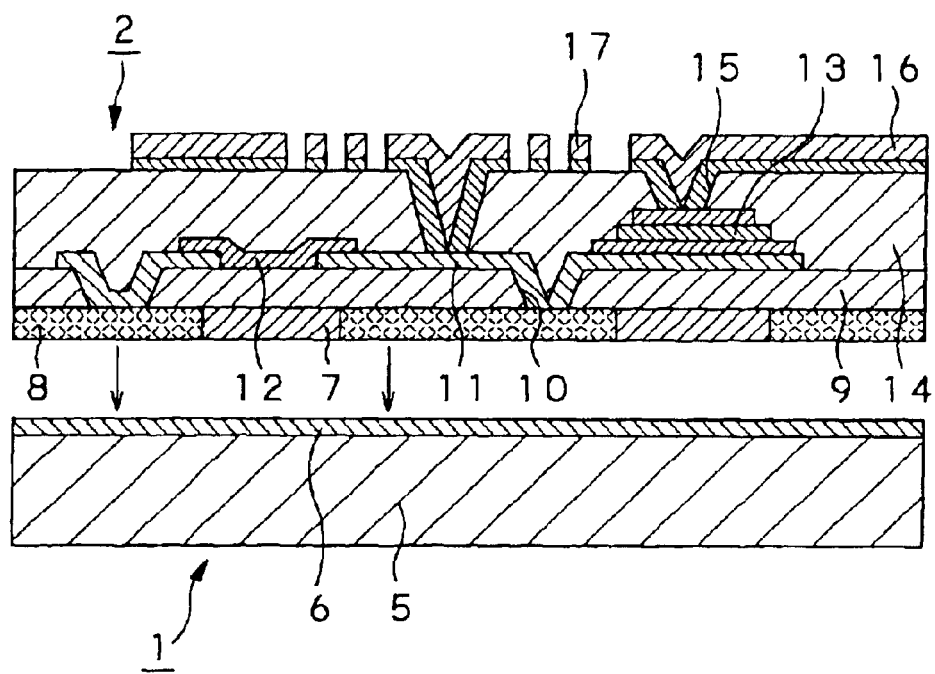
FIG. 9 is an axial sectional view of the mother substrate shown in FIG. 8, showing the process of separating, from the mother substrate, the circuit block having been produced through the processes shown in FIGS. 2 to 8.

The RF module producing method according to the present invention further includes a ninth step S-9, as in FIG. 1, in which the stacked assembly of the mother substrate 1 and circuit block 2 is immersed in an acid or alkaline solution to separate the circuit block 2 from the mother substrate 1. This step will be explained with reference to FIG. 9. When the stacked assembly is immersed in a an acid solution, the release layer 6 made of copper as mentioned above will be dissolved at the interface thereof with the first insulating layer 7 and first wiring layer 8 (release surface H) and thus the circuit block 2 will smoothly be released or separated from the mother substrate 1, namely, from the upper surface of the release layer 6 as shown in FIG. 9. In the circuit block 2, the exposed surfaces of the first insulating layer 7 and first wiring layer 8 provide the release surface H.

In case the stacked assembly of the circuit block 2 and mother substrate 1 is immersed in a nitric acid solution for example, the release layer 6 made of copper will slightly be dissolved at the surface thereof and thus the circuit block 2 will be released from the mother substrate 1. It should be noted that since the release surface H of the first wiring layer 8 of the circuit block 2 will be attacked by the nitric acid solution in this case, a protective layer may be preformed between the release surface H and release layer 6 to prevent such attacking.

In case the release layer 6 is formed from Cu and polyimide layers, the Cu layer will be dissolved when the stacked assembly of the circuit block 2 and mother substrate 1 is immersed in the hydrochloric acid solution and the circuit block 2 will be released at the interface of the Cu and polyimide. That is, the polyimide layer will be left at the side of the first insulating layer 7 and first wiring layer 8. In this case, the polyimide layer is removed by dry etching with oxygen plasma for example.

Since in the aforementioned method of producing the circuit block 2, a plurality of layers forming together the circuit block 2 is formed on the principal surface of the mother substrate 1 with a high-precision planarized surface and large mechanical strength, so the thin-film passive components such as the thin-film resistor 12, thin-film capacitor 13, etc. formed in the insulating and wiring layers can be formed with an extremely high precision. To produce the circuit block 2 according to the present invention, a conventional semiconductor processing equipment can be used for forming a high-precision etching resist layer, plating resist layer and insulating layers and for applying, exposing and developing the resist, to thereby form a wiring pattern of 1 μm or less in width in each wiring layer.

Since the circuit block 2 thus produced using the mother substrate 1 formed from the above silicon or glass substrate hardly incurs any warping, shrink, waving or irregularity, which will take place in a conventional printed wiring board formed from an organic substrate or ceramic substrate as a mother substrate and through various steps of processing, so various layers, thin-film passive components and wiring patterns can be formed with a high precision. According to the present invention, the circuit block 2 can be formed without being adversely affected by the heat (which will be a problem in case the mother substrate is formed from an organic material) during hot processing of various insulating layers and without any problem of degassing or refuse removal when the sputter layer is formed in a vacuum state.

Even in case there is a difference in density from one wiring pattern to another formed in the wiring layers, the circuit block 2 can be prevented from incurring warping, waving or irregularity because it is formed on the mother substrate 1 having the mechanical strength in the aforementioned method of producing the circuit block 2 according to the present invention. Therefore, according to the present invention, there can be produced a highly reliable circuit block 2 having various wiring layers formed thereon with a high precision. Since the circuit block 2 incurs little warping, waving or irregularity, it can positively be mounted without any poor soldering or the like.

Figure 10:
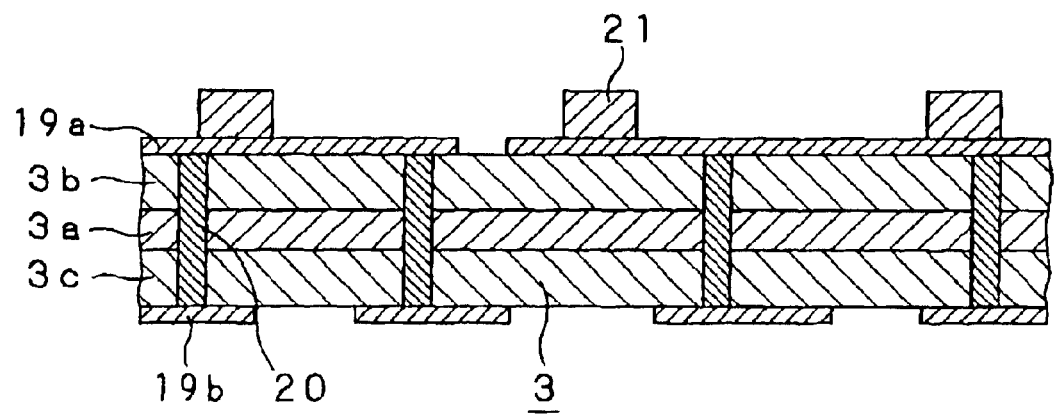
FIG. 10 is an axial sectional view of a base circuit board.

According to the present invention, the circuit block 2 separated from the mother substrate 1 is bonded to the base circuit board 3 and then undergoes the processes of mounting electronic parts as will be described later to provide the RF module 4. According to the present invention, the base circuit board 3 is formed from a multilayer organic substrate or ceramic substrate. As shown in FIG. 10, the base circuit board 3 includes a core substrate 3a and multilayer wiring layers 3b and 3c from on the front and rear sides, respectively, of the core substrate 3a. The upper and lower wiring layers 3b and 3c are appropriately connected to each other by a plurality of interlayer vias 20. In the base circuit board 3, a wiring pattern 19a is formed on the top of the upper wiring layer 3b and a terminal land 19b is formed on the bottom of the lower wiring layer 3c.

The base circuit board 3 is formed from a multilayer ceramic substrate of alumina, glass ceramic aluminitelide or mullite as a base material, a multilayer organic. substrate of glass epoxy, polyimide, bismaleitotriazine resin, polyphenylethylene resin, phenol resin, polyolefine resin or polytetrafluoroethylene as a base material, or a buildup substrate having formed on one of the principal surfaces thereof a multilayer wiring layer consisting of a dielectric resin layer of photosensitive or non-photosensitive epoxy resin, polyimide or benzocyclobutene and a metal plating layer.

In step S-10 as in FIG. 1, a plurality of post-bumps 21 is formed on the wiring pattern 19a on the upper wiring layer 3b in the base circuit board 3. The post-bumps 21 are formed from copper bumps by electrolytic-copper plating or electroless plating. Also, each of the post-bumps 21 is shaped to have nearly the same thickness as under-fills 22 which will be described later, namely, a thickness of 20 to 100 μm for example. In this step, the post-bump 21 may be plated on the surface thereof with nickel-gold or solder.

Figure 11:
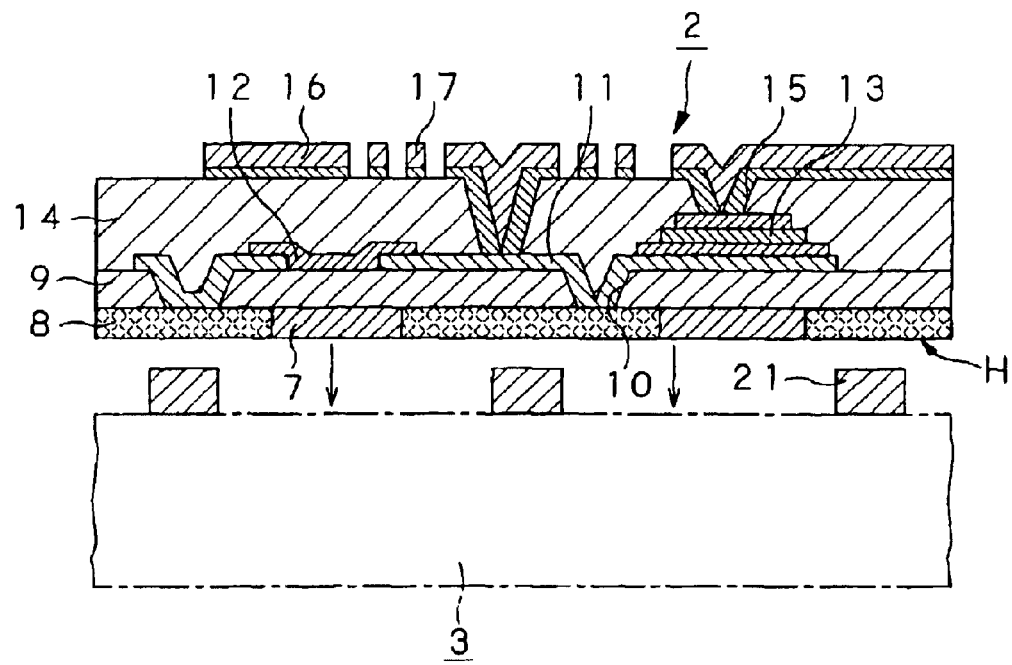
FIG. 11 is an axial sectional view showing the process of bonding the circuit block separated from the mother substrate as shown in FIG. 9 to the base plate shown in FIG. 10.
Figure 12:
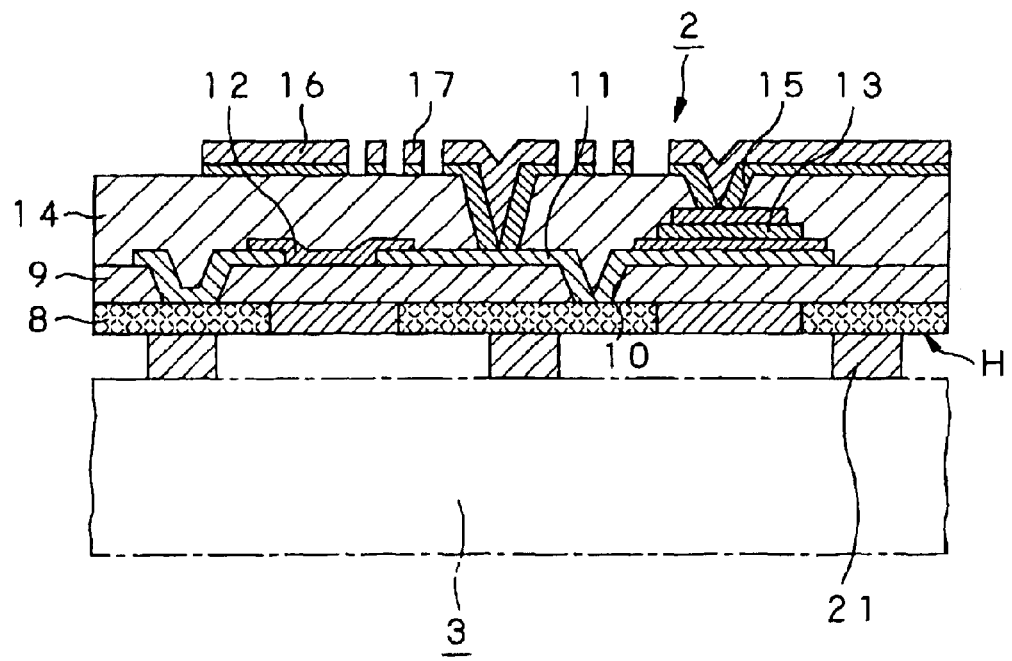
FIG. 12 is an axial sectional view of the circuit block and base circuit board bonded to each other as in FIG. 11.

The RF module producing method according to the present invention further includes a tenth step S-11, as in FIG. 1, in which the circuit block 2 is bonded to the base circuit board 3 having the post-bumps 21 formed thereon. This step will be explained with reference to FIGS. 11 and 12. As shown in FIG. 11, the circuit block 2 is bonded at the release surface H of the first insulating layer 7 and first wiring layer 8 thereof to the base circuit board 3. The patterned lands on the first wiring layer 8 of the circuit block 2 are connected to the corresponding post-bumps 21 to provide a bonded assembly of the circuit block 2 and base circuit board 3 as shown in FIG. 12.

In case the post-bump 21 is plated with solder or formed from, the base circuit board 3 can be bonded to the lands on the first wiring layer 8 in the tenth step S-11. In case the first wiring layer 8 has a gold layer formed on the surface thereof, it will be less oxidized at the surface thereof so that the solder will flow more smoothly and thus the circuit block 2 can be better soldered to the post-bumps 21 in this bonding step S-11 than in case the first wiring layer 8 is formed from copper.

In case the post-bumps 21 and land on the first wiring layer 8 have gold layers formed on their surfaces, respectively, the circuit block 2 and base circuit board 3 are bonded at the lands and post-bumps 21 to each other by gold-to-gold hot pressing or ultrasonic bonding in the tenth step S-11. The circuit block 2 and base circuit board 3 may be bonded at the lands on the first wiring layers 8 and post-bumps 21 of the base circuit board 3 to each other by any other technique which would be appropriate.

Figure 13:
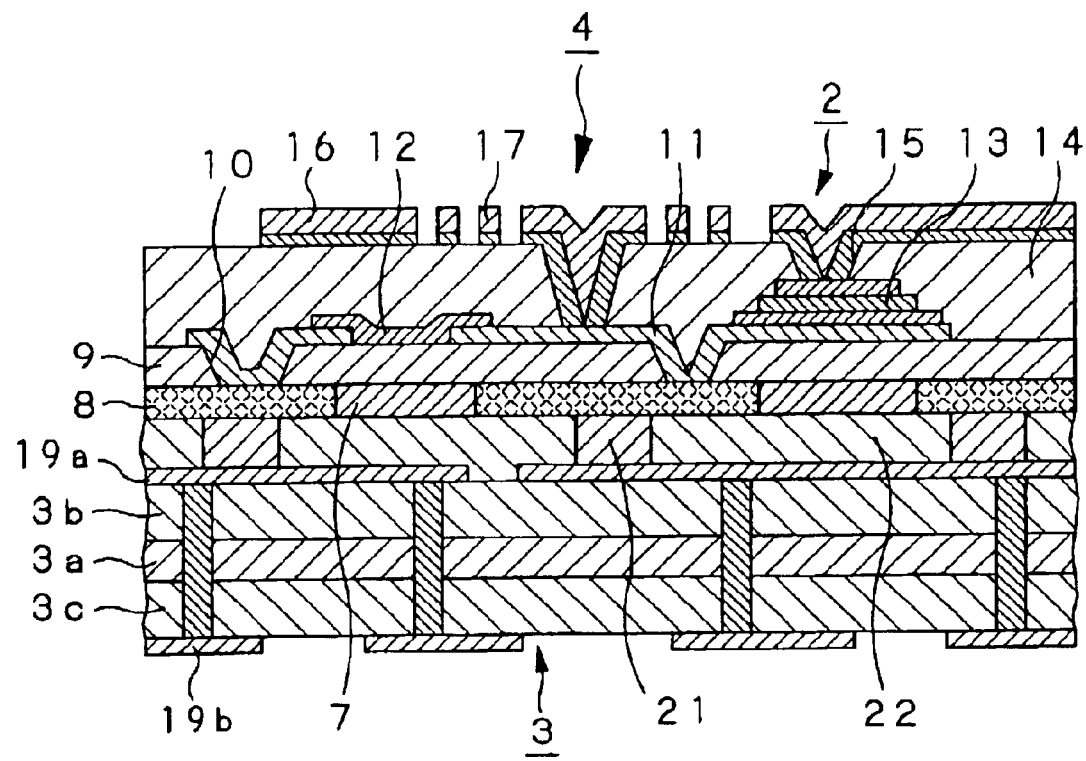
FIG. 13 is an axial sectional view of another RF module.

The RF module producing method according to the present invention further includes an eleventh step S-12, as in FIG. 1, in which an under-fill 22 is charged into a space defined by the post-bumps 21 provided between the circuit block 2 and base circuit board 3. This step will be explained with reference to FIG. 13. The under-fill 22 is an ordinary one and charged as in the flip-chip bonding of a semiconductor chip for example. The under-fill 22 contains particles whose diameter is smaller is smaller than the thickness of the post-bump 21, so that it can evenly charged between the release or bonding surface H of the circuit block 2 and the principal surface of the base circuit board 3 as shown in FIG. 13.

The RF module 4 according to the present invention is produced through the aforementioned various processes. The RF module producing method further includes a step S-13, as in FIG. 1, in which for example, RF ICs, chip parts, etc. are mounted on the third wiring layer 16 of the circuit block 2, and also a step S-14, as in FIG. 1, in which the circuit block 2 is mounted on a mother substrate or a step in which a shield cover to sheath the circuit block 2.

In the RF module producing method according to the present invention, the circuit block 2 produced with a high precision through the aforementioned series of processes is mounted on the base circuit board 3 formed from the multilayer organic or ceramic substrate to provide the RF module 4. Since in the RF module producing method according to the present invention, the base circuit board 3 is produced independently of the circuit block 2, it may be a one produced through the conventional processes of producing a multilayer substrate. Therefore, according to the present invention, the high-precision, highly-functional RF module 4 can efficiently be produced with less costs and without being limited by the materials.

Figure 14:
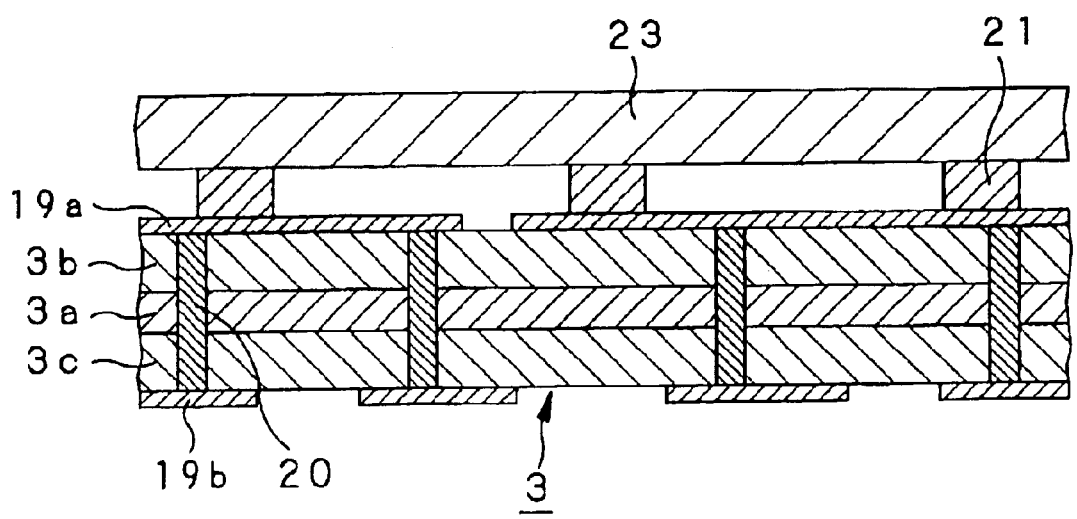
FIG. 14 is an axial sectional view of the base circuit board having an adhesive layer provided thereon.

In the aforementioned embodiment of the present invention, the circuit block 2 and base circuit board 3 are bonded to each other by bonding the lands on the first wiring layer 8 and post-bumps 21 to each other and charging the under-fill 22 into the space defined by the post-bumps 21 provided between the circuit block 2 and base circuit board 3. However, the present invention is not limited to this manner of bonding. Namely, the circuit block 2 and base circuit board 3 may be bonded to each other via an adhesive layer 23 provided on the principal surface of the base circuit board 3 and electrically connected to each other as shown in FIGS. 14 to 17. The adhesive layer 23 is of an epoxy resin adhesive or an acrylic resin adhesive, or preferably of a thermosetting type resin adhesive. The adhesive layer 23 is formed to a uniform thickness on the principal surface of the base circuit board 3, where the post-bumps 21 are formed, as shown in FIG. 14. It should be noted that the adhesive layer 23 may be a uniformly thick plate-like adhesive layer of the same material as any of the above-mentioned ones and bonded to the principal surface of the base circuit board 3.

Figure 15:
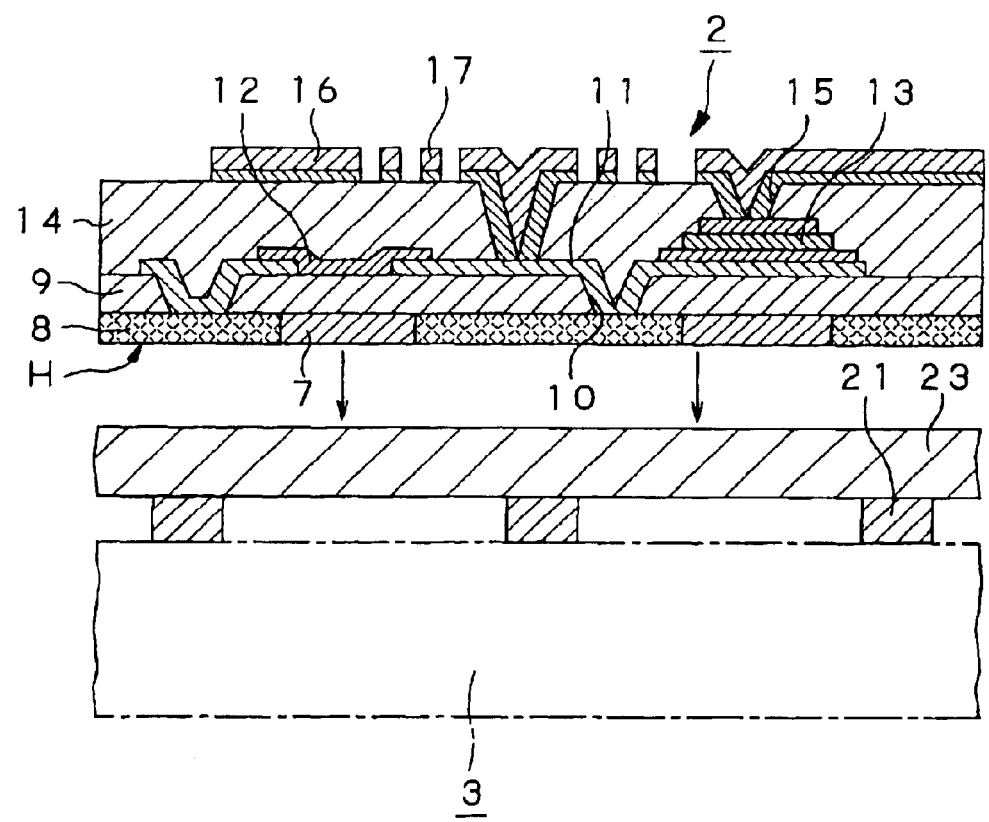
FIG. 15 is an axial sectional view showing the process of bonding the circuit block to the base circuit board.
Figure 16:
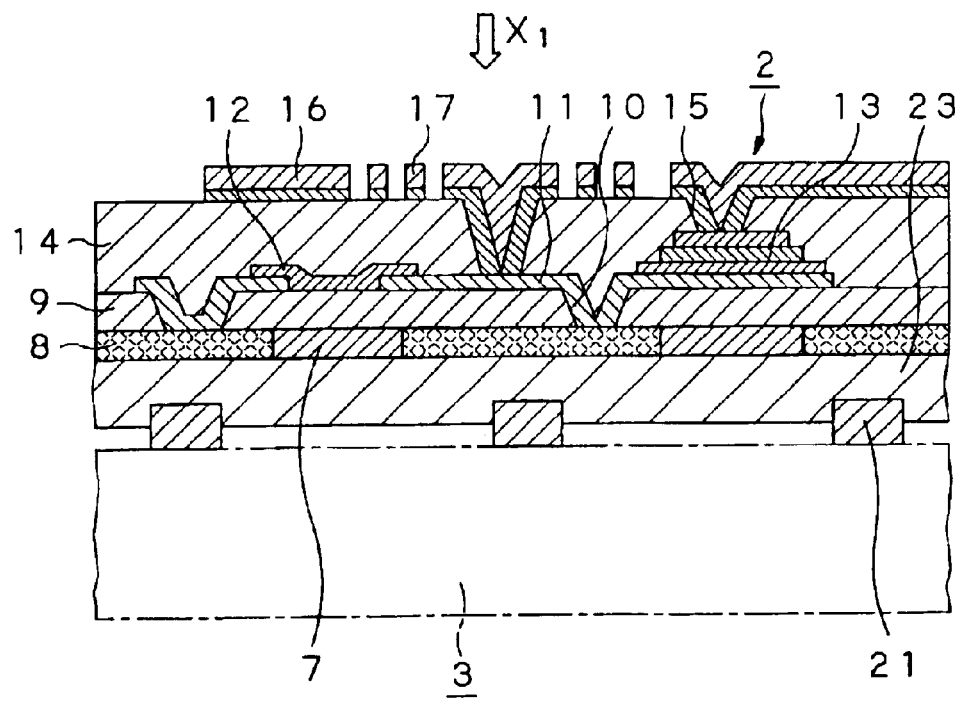
FIG. 16 is an axial sectional view showing the process of bonding, by thermo compression bonding technique, the circuit block to the base circuit board.

In this RF module producing method, the circuit block 2 is bonded at the release surface H of the first insulating layer 7 and first wiring layer 8 thereof as a bonding surface to the base circuit board 3 at the adhesive layer 23 as shown in FIG. 15. For this bonding, a suitable positioning jig is used to position the circuit block 2 and base circuit board 3 for the lands on the first wiring layer 8 to be opposite to the post-bumps 21, and then the circuit block 2 is hot-pressed in the direction of arrow $X_1$ in FIG. 16 to the base circuit board 3. At this time, the post-bumps 21 will penetrate into the adhesive layer 23 as the circuit block 2 is pressed, as shown in FIG. 16.

Figure 17:
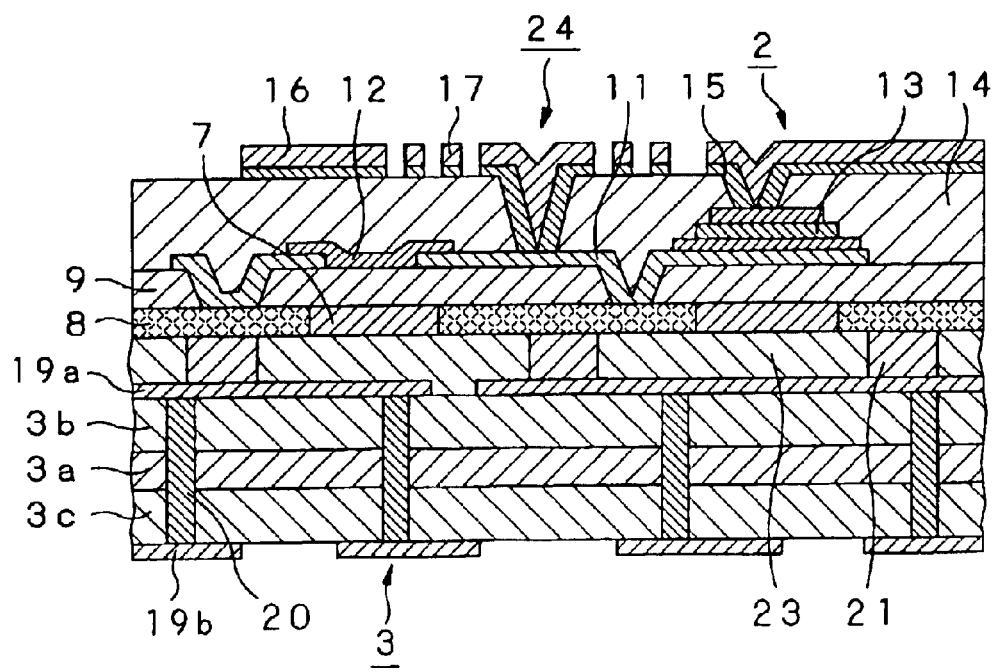
FIG. 17 is an axial sectional view of still another RF module.

As the circuit block 2 is further pressed, the post-bumps 21 will penetrate through the adhesive layer 23 and abut their corresponding lands on the first wiring layer 8. Thus, the lands on the base circuit board 3 and those on the first wiring layer 8 at the circuit block 2 are electrically connected to each other by the post-bumps 21, respectively, as shown in FIG. 17. Thus, the circuit block 2 and base circuit board 3 are integrally bonded to each other by means of the adhesive layer 23 to provide the RF module 24 as shown in FIG. 17.

As above mentioned, this variant of the RF module producing method permits to simultaneously bond and electrically connect the circuit block 2 and base circuit board 3 to each other, while making it unnecessary to use the under-fill 22 and charge the latter between the circuit block 2 and base circuit board 3. It should also be noted that ultrasound may be applied to between the lands on the first wiring layer 8 and post-bumps 21 on the base circuit board 3, bonded to each other to connect the circuit block 2 and base circuit board 3 more positively to each other. Also, the bonding surfaces of the lands on the first wiring layer 8 and those of the post-bumps 21 on the base circuit board 3 may be coated a gold layer, respectively, for more positive and easier bonding between the circuit block 2 and base circuit board 3.

Figure 18:
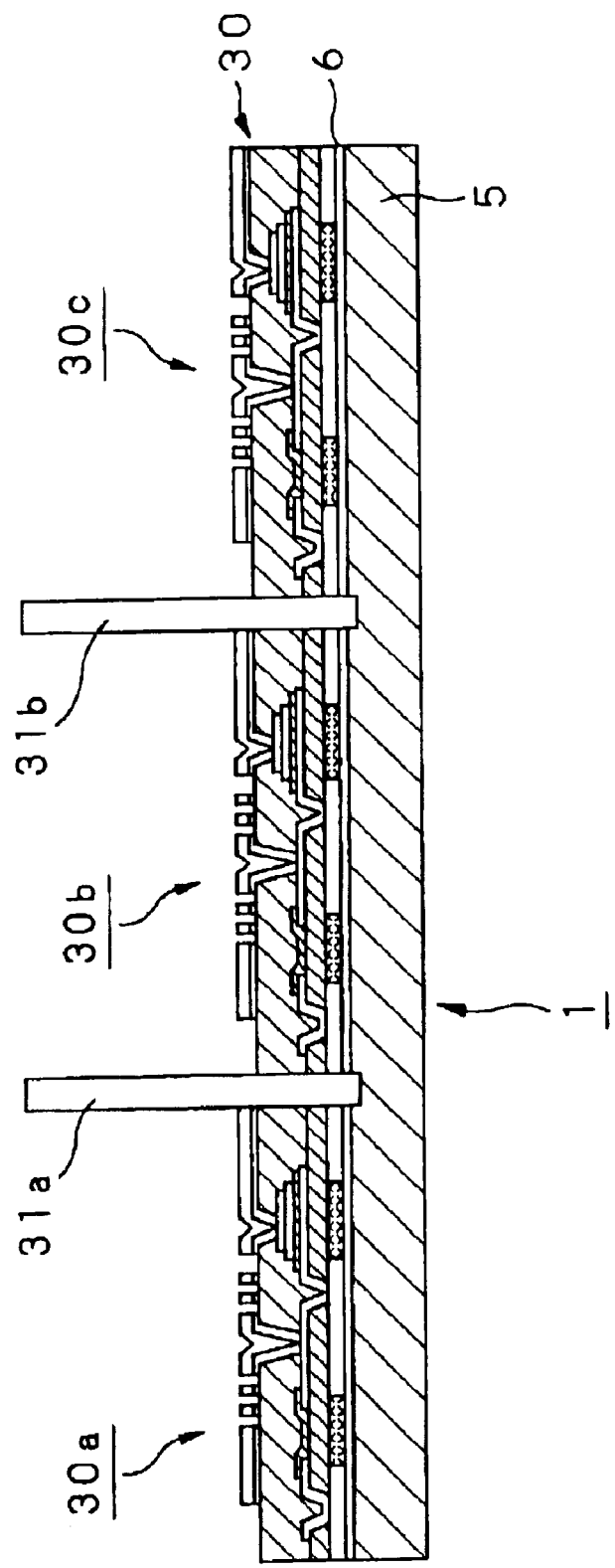
FIG. 18 is an axial sectional view showing the process of cutting the circuit block assembly into circuit blocks.
Figure 19:
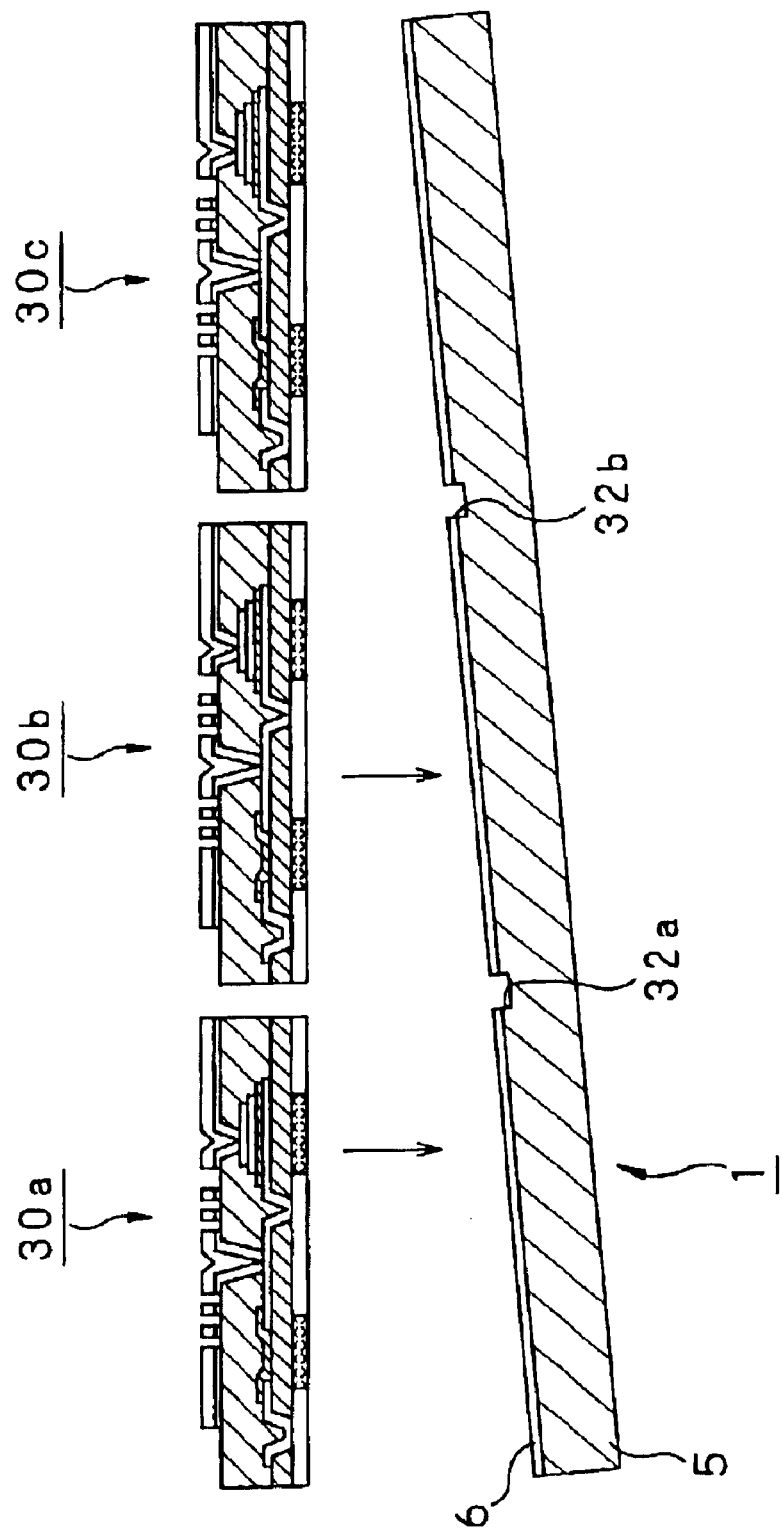
FIG. 19 is an axial sectional view showing the process of separating the circuit blocks from the mother substrate.

In the aforementioned embodiment of the present invention, one circuit block 2 is formed on the principal surface of the mother substrate 1 with the release layer 6 being disposed between them. As shown in FIGS. 18 and 19, however, there may be formed on the mother substrate 1 a circuit block assembly 30 including a plurality of circuit blocks 30a to 30n formed integrally in juxtaposition with each other. The circuit block assembly 30 will not be described in detail. The circuit blocks 30a to 30n are joined to each other at each boundary of juxtaposition and formed collectively on the principal surface of the mother substrate 1 through the same production processes as the aforementioned ones for the single circuit block 2.

The circuit block assembly 30 is set on a dicing apparatus (not shown), and cut by cutters 31a and 31b into the circuit blocks 30a to 30n as shown in FIG. 18. This cutting is effected as in the conventional semiconductor chip production process to cut the circuit block assembly 30 into the circuit blocks 30a to 30n with a high precision. The circuit blocks 30a to 30n are thus isolated from each other but still kept stacked on the mother substrate 1.

Then, the circuit blocks 30a to 30n are released from the mother substrate 1 as having previously been described. The circuit blocks 30a to 30n are thus separated from the release layer 6 on the mother substrate 1 as shown in FIG. 19. Each of the circuit blocks 30a to 30n is to be bonded to the base circuit board 3.

When the circuit block assembly 30 is cut as above, a cutter 31 will make an incisure 32 in the principal surface of the base material 5 of the mother substrate 1 as shown in FIG. 19. Since the incisure 32 will spoil the flatness of the mother substrate 1, the latter will not be reusable as it is for making a next block circuit assembly 30. The mother substrate 1 is discarded, or the principal surface thereof is polished again and the incisures 32 are repaired to regenerate the release layer 6.

In the above context, there is also usable a mother substrate 1 having a dummy layer 35 provided between the base material 5 and release layer 6 thereof as shown in FIGS. 20A to 20D. The dummy layer 35 is formed with a high precision on the principal surface of the base material 5 from an appropriate mechanically rigid synthetic resin. The dummy layer 35 is shaped to have such a thickness that the blade or edge of the cutter 31 will not reach the base material 5 when cutting the circuit block assembly 30 as above.

Figure 20:
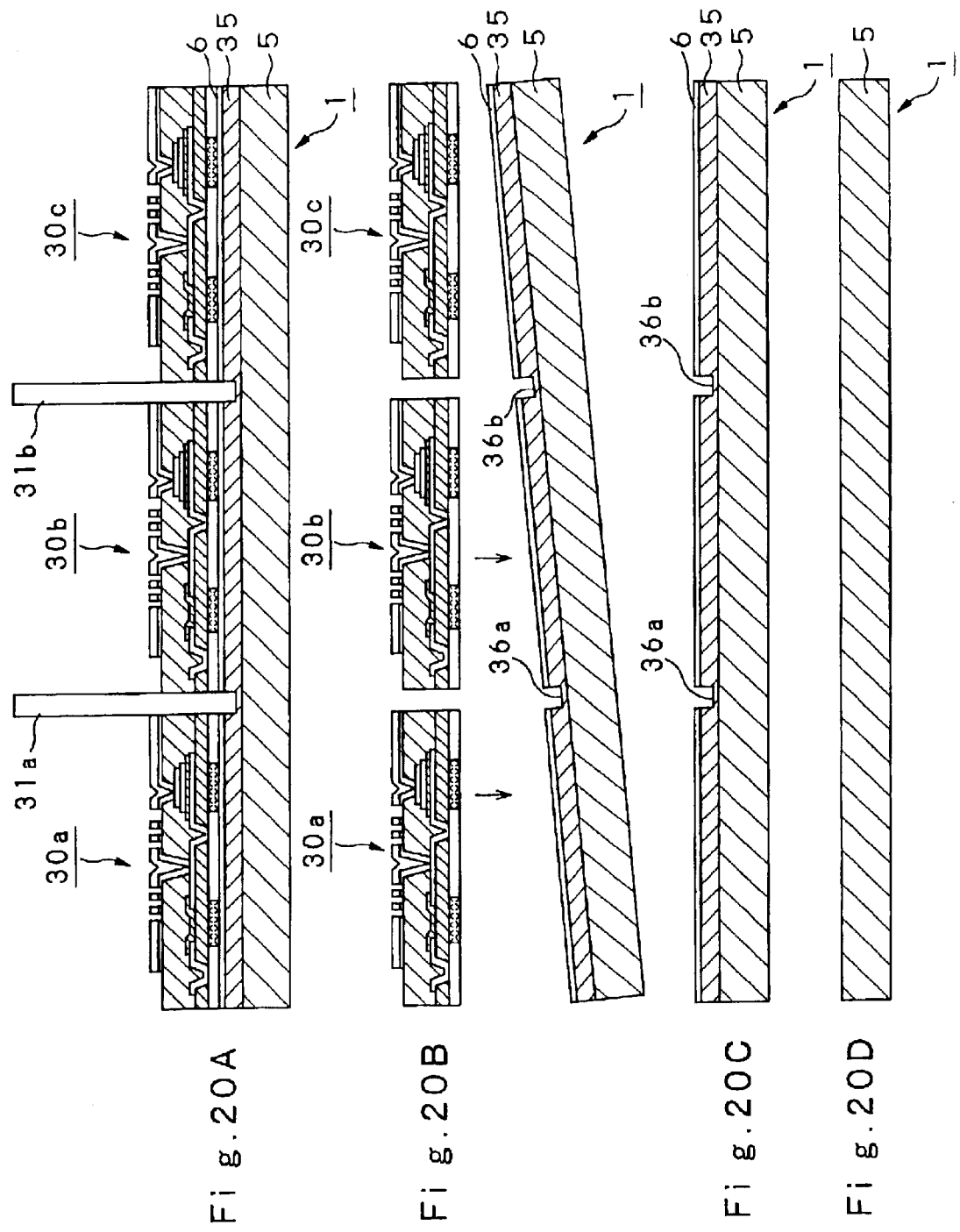

The circuit block assembly 30 is cut into circuit blocks 30a to 30n as follows:

The operation of the cutter 31 of the dicing apparatus is so controlled that the edge of the cutter of the cutter 31 will be stopped within the dummy layer 35 as shown in FIG. 20A. Then, the circuit blocks 30a to 30n are released separately from the release layer 6 of the mother substrate 1 as shown in FIG. 20B. The cutters 31 make incisures 36 in the release layer 6 and dummy layer 35 of the mother substrate 1 but the base circuit board 5 is not damaged as shown in FIG. 20C. Thereafter, the incised dummy layer 35 and release layer 6 are removed from the base material 5 as shown in FIG. 20D.

The base material 5 is recovered, a dummy layer 35 and releaser layer 6 are formed again on the principal surface of the base material 5, and the mother substrate 1 thus regenerated is reused for production of a next circuit block assembly 30. In the mother substrate 1, the dummy layer 35, if formed from a resin material, can easily be removed from the base material 5. Since the dummy layer 35 and release layer 6 can easily formed on the base material 5 to provide the mother substrate 1, the base material 5 which is relatively expensive can be recycled, which can also reduce the manufacturing costs and time.

Figure 21:
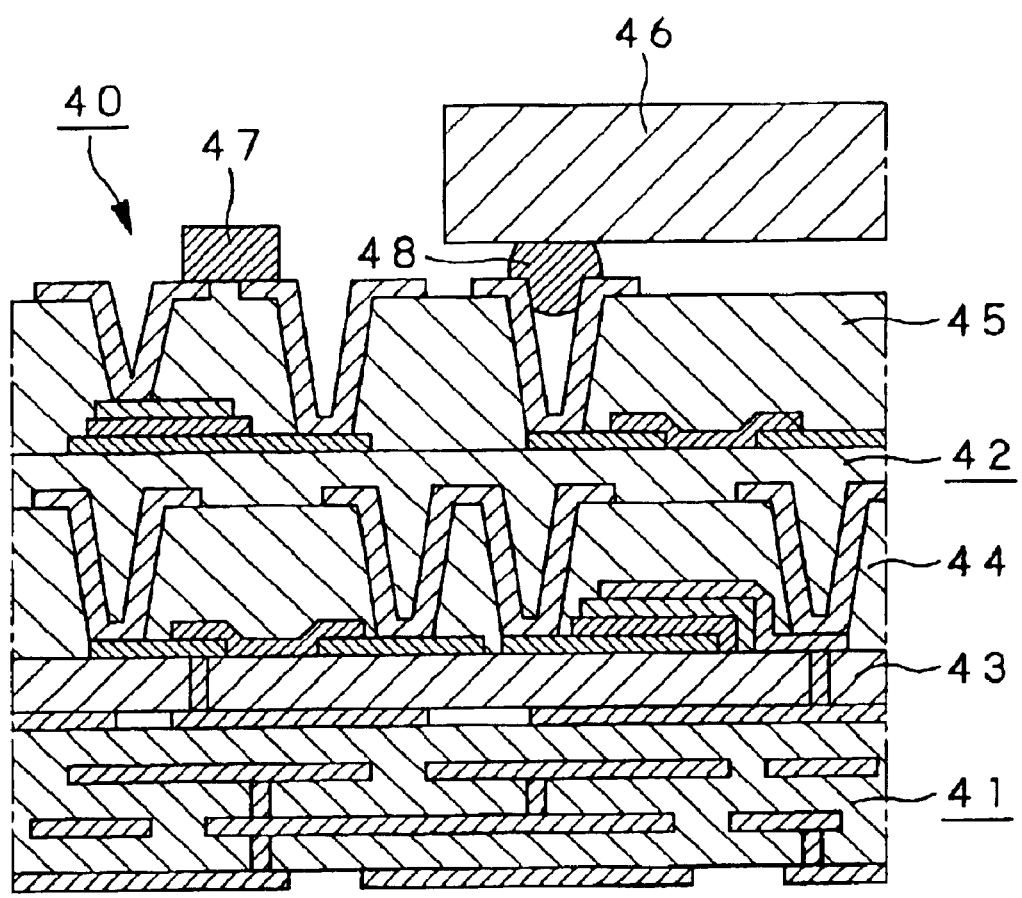
FIG. 21 is an axial sectional view of yet another RF module.

FIG. 21 shows a radio frequency (RF) module 40 according to the present invention. As shown, the RF module 40 includes a base circuit board 41 as a first layer, consisting of multiple wiring substrates, a first wiring layer 43, and an RF component layer 42 consisting of a second wiring layer 44 and third wiring layer 45, these layers being bonded to each other, and also an RF IC 46 and chip part 47 mounted on the third wiring layer 45. In the RF module 40, each of the wiring layers 43 to 45 is formed from an insulating layer and wiring layer as in the circuit block 2. In the RF module 40, the second and third wiring layer have formed therein a plurality of passive components. As shown, the RF module 40 has the RF IC 46 mounted, by the flip-chip mounting technique, on a solder bump 48 or the like provided the third wiring layer 45, and the chip part 47 mounted directly on the third wiring board 45.

In the RF module 40, the base circuit board 41 is formed from an organic wiring substrate and has formed thereon power and ground lines and control signal lines to supply a power and control signals to the RF component layer 42. In the RF module 40, the RF component layer 42 has an RF signal circuit formed therein to process analog RF signals. Also, in the RF module 40, the base circuit board 41 and RF component layer 42 are electromagnetically isolated from each other so that any electromagnetic interference is prevented from taking place and thus the RF module 40 has an improved characteristic. Further, since in the RF module 40, power and ground lines each having a sufficient area can be formed on the base circuit board 41, a power can be supplied to the RF component layer 42 with a high regulation.

Figure 22:
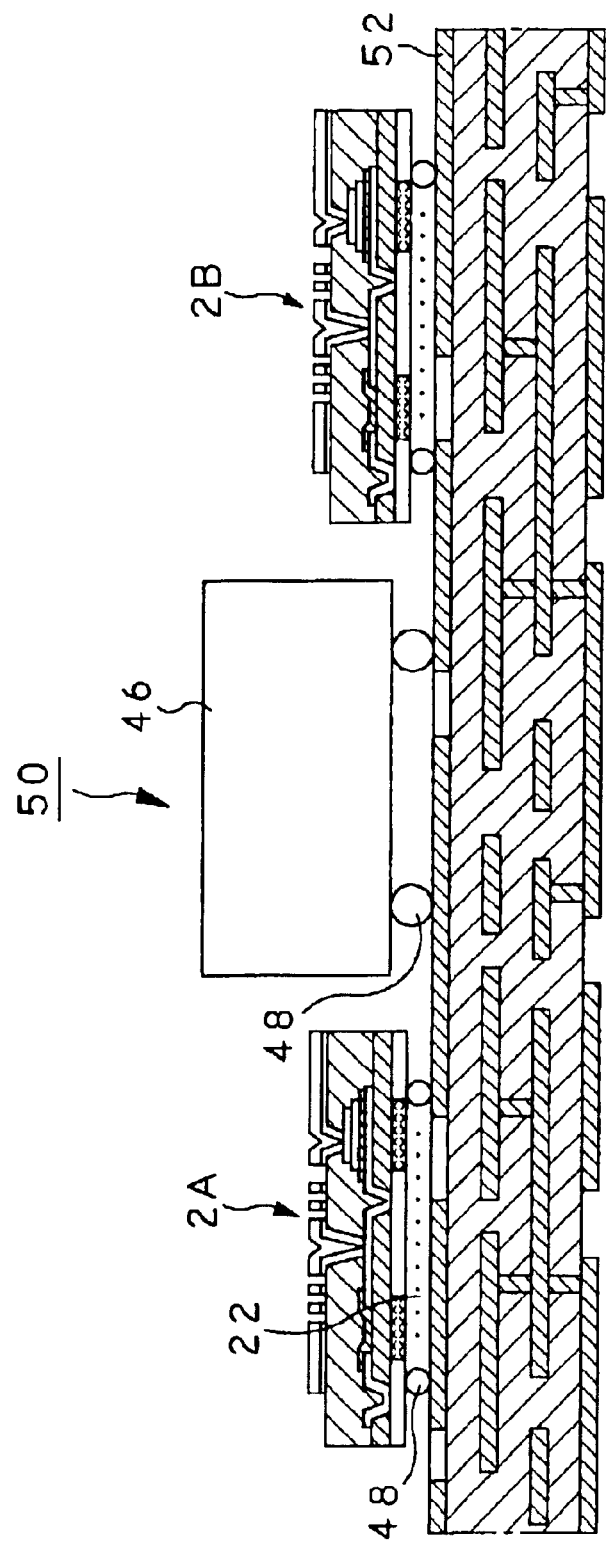
FIG. 22 is an axial sectional view of still yet another RF module.

The circuit block 2 produced according to the present invention through the aforementioned processes is mounted directly on a substrate 51 similarly to the RF IC 46 and chip part 47 to build a wiring circuit device 50 as sown in FIG. 22. The wiring circuit device 50 has a wiring pattern 52 appropriately formed on the principal surface of the substrate 51, and solder bumps 48 or the like are formed on the wiring pattern 52. The circuit block 2 includes circuit blocks 2A and 2B. The circuit blocks 2A and 2B are mounted on the solder bumps 48 on the substrate 51. By mounting the high-precision circuit blocks 2 as one-chip parts on the substrate 51, the wiring circuit device 50 is produced with a high precision and less costs. Since the high-precision circuit blocks 2 can be provided in desired positions on the substrate 51, the wiring circuit device 50 can be formed compact and lightweight.

Figure 23:
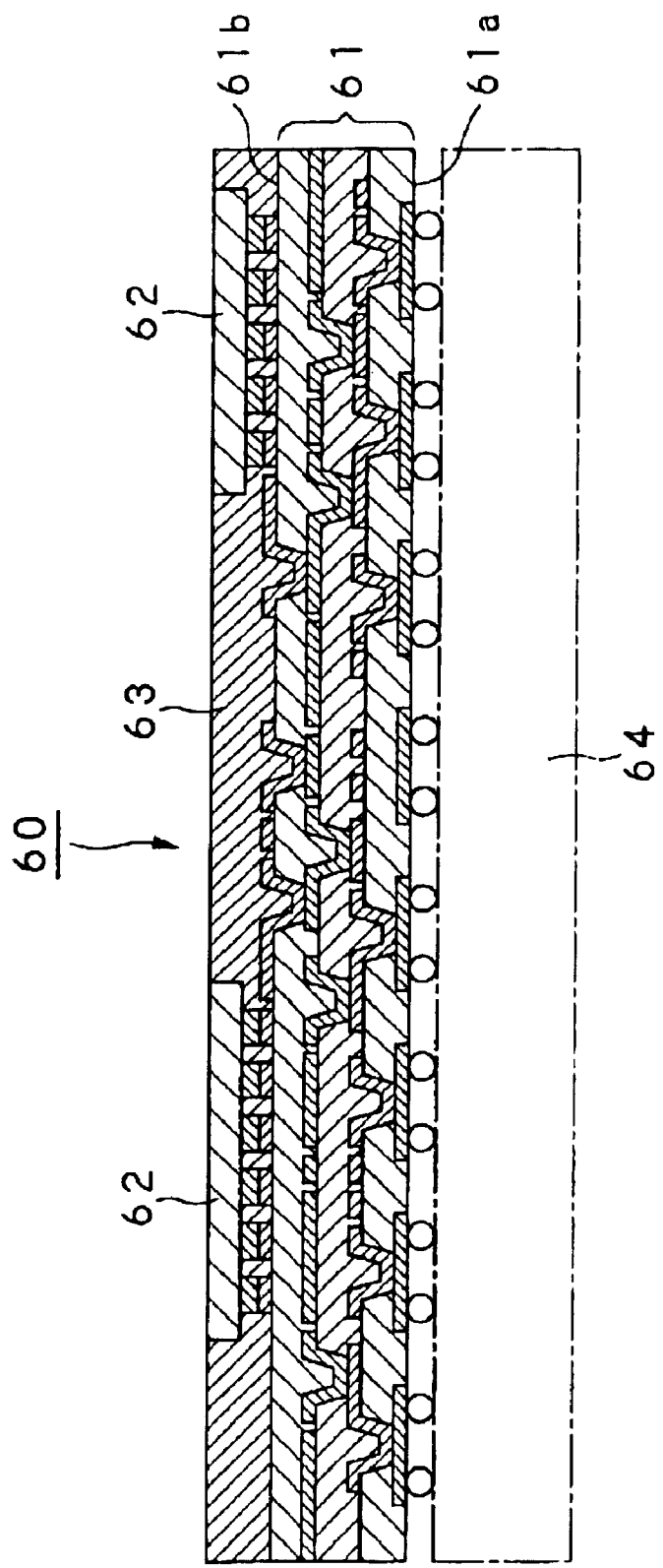
FIG. 23 is an axial sectional view of the semiconductor module according to the present invention.

In the embodiment of the present invention, the multilayer circuit block 2 is formed on the mother substrate 1, released from the release layer 6 on the mother substrate 1, and then mounted on the base circuit board 3 to produce the RF module 40. However, the present invention is not limited to this embodiment. Namely, the present invention is applicable to a semiconductor module 60 produced by mounting a plurality of semiconductor chips 62 on the surface of a four-layer circuit block 61 by the face-down bonding technique as shown in FIG. 23 for example. It should be noted that the circuit block 61 is similar in basic construction and production process to the aforementioned circuit block 2 and so will be described in detail.

In the above semiconductor module 60 according to the present invention, the semiconductor chips 62 are mounted on the surface of the circuit block 61 and also sealing resin layers 63 to seal the semiconductor chips are formed on the surface of the circuit block 61. Also, in the semiconductor module 60, the semiconductor chips 62 are mounted highly densely on the high-precision circuit block 61 having narrow-pitched wiring pattern. Further, in the semiconductor module 60, the semiconductor chips 62 and sealing resin layers 63 polished at the surfaces thereof to be thin. Moreover, in the semiconductor module 60, each circuit block 61 has a first wiring layer 61a which is exposed when the circuit block 61 is separated from the mother substrate 1. The first wiring layer 61a serves as an external electrode.

In the above semiconductor module 60, the wiring layers included in the circuit block 61 are connected to each other through the vias 10 appropriately formed between the layers, and a plurality of electrode pads 62b is formed on the uppermost wiring layer correspondingly to areas where the semiconductor chips 62 are mounted. The electrode pads 62b are formed correspondingly to a plurality of bonding pads formed on the areas where the semiconductor chips 62 are mounted. Also, since the circuit block 61 is produced through the aforementioned processes, the electrode pads 62b are formed with a high precision correspondingly to the plurality of bonding pads formed at a small pitch on the semiconductor pads 62.

The above semiconductor module 60 is produced by producing the circuit block 61 on the mother substrate 1 through the aforementioned processes, mounting the semiconductor chips 62 on the circuit block 61, forming the sealing resin layer 63 and polishing the semiconductor chips 62 and sealing resin layer 63, and separating the thus formed semiconductor module 60 from the mother substrate 1. The semiconductor chips 62 are mounted on the circuit block 61 by the flip-chip bonding technique with a solder bump being provided on each of the pad electrodes 61b of the circuit block 61, for example. Alternatively, the semiconductor chips 62 may be mounted on the circuit block 61 by any other well-known face-down bonding technique such as TAB (tape automated bonding), beam lead bonding or the like.

According to the present invention, the semiconductor module 60 is produced by forming the high-precision circuit block 61 on the highly planarized mother substrate 1, and mounting the semiconductor chips 62 on the circuit block 61 with the circuit block 61 being held on the mother substrate 1, namely, before separating the circuit block 61 from the mother substrate 1. The semiconductor chips 62 can be mounted with a high precision on the circuit block 61 having no warping, waving or irregularities.

The sealing resin layer 63 is formed on the surface of the circuit block 61 while the latter having the semiconductor chips 62 mounted thereon is being held on the mother substrate 1. The sealing resin layer 63 is formed from an epoxy resin for example by the transfer molding or printing to seal the semiconductor chips 62. The sealing resin layer 63 this formed will protect the semiconductor chips 62 and connecting electrodes mechanically and electrically.

After the above forming of the sealing resin layer 63, the sealing resin layer 63 is polished at the surface thereof by the mechanical polishing with a grinder, chemical polishing with wet etching or with both the mechanical and chemical polishing techniques while the circuit block 61 is still held on the mother substrate 1. In this polishing step, the semiconductor chips 62 are also polished at the surfaces thereof to such a maximum extent as will not spoil the mechanical strength of the semiconductor chips 62. Since the semiconductor chips 62 are mechanically protected by the sealing resin layer 63 formed around them, they can be polished to the maximum extent without occurrence of any damage such as edge fracture to the semiconductor chips 62 even if they are subjected to a mechanical polishing.

The method of producing the semiconductor module 60 according to the present invention permits to produce the semiconductor module 60 of a thin structure having the semiconductor chips 62, of less than 100 $\mu$m in thickness, mounted on the thin circuit block 61, without using any thin semiconductor chip having been polished while it is still in a state of wafer. Since the semiconductor chip 62 used in this method is not any one, it will hardly be chipped or cracked and can easily be handed during transport to any next process, and thus the highly reliable semiconductor module 60 can be produced with an improved efficiency.

Note that the semiconductor chips 62 and sealing resin layer 63 may be polished after the circuit block 61 is separated from the mother substrate 1 but it is more efficient and reliable to make such a polishing while the semiconductor module 60 is kept held on the mother substrate 1 as a support base to maintain the mechanical rigidity.

The semiconductor module 60 having been produced through the aforementioned processes is then mounted, by bonding, on a mother board (base circuit board) 64 indicated with a dashed line as shown in FIG. 23 for example. Namely, the semiconductor module 60 is mounted on the base circuit board 64 by bonding the external electrodes 61a formed on the circuit block 61 to connection pads formed on the principal surface of the base circuit board 64 electrically and mechanically. Particularly, the mounting is done by the face-down bonding technique as in the above-mentioned mounting of the semiconductor chips 62 on the circuit block 61.

According to the present invention, semiconductor chips 62 having different functions are mounted on the circuit block 61 to provide an MCM (multi-chip module) semiconductor device. Since the semiconductor chips 62 are mounted with a high density on the circuit block 61 and a high-density wiring pattern is formed, there can be provided an MCM semiconductor device having a small and thin structure and less L, C and R components in the wiring pattern.

Figure 24:
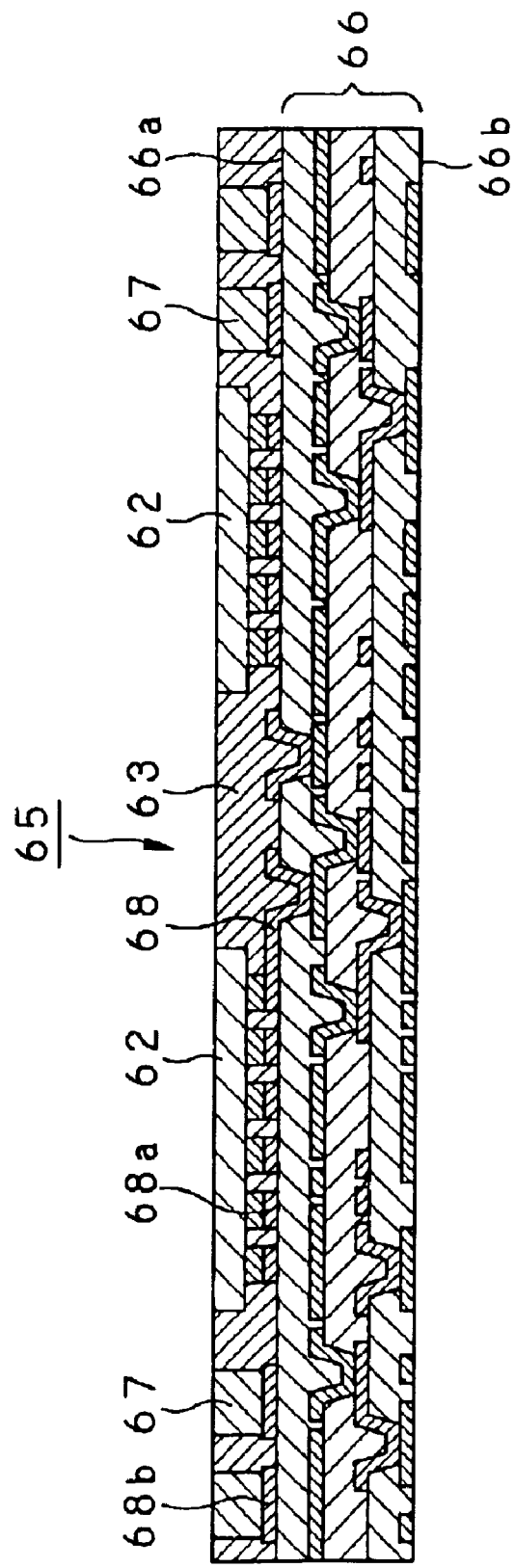
FIG. 24 is an axial sectional view of the semiconductor module shown in FIG. 23 and having external-connection terminals formed on the side thereof where semiconductor chips are to be mounted.

In the aforementioned semiconductor module 60 according to the present invention, the semiconductor chips 62 are mounted on the uppermost wiring layer, so any other surface-mounted type parts are not mounted on the circuit block 61. FIG. 24 shows a semiconductor module 65 including a circuit lock 66 having also a plurality of external-connection terminals 67 a mounting surface 66a for the semiconductor chips 62. Each of the external-connection terminals 67 is formed as a projecting electrode made of a metal on the mounting surface 66a, for the semiconductor chips 62, of the circuit block 66 through processes which will be described in detail later. As shown in FIG. 24, each of the external-connection terminals 67 is exposed from the sealing resin layer 63 whose surface has been polished.

Figure 25:
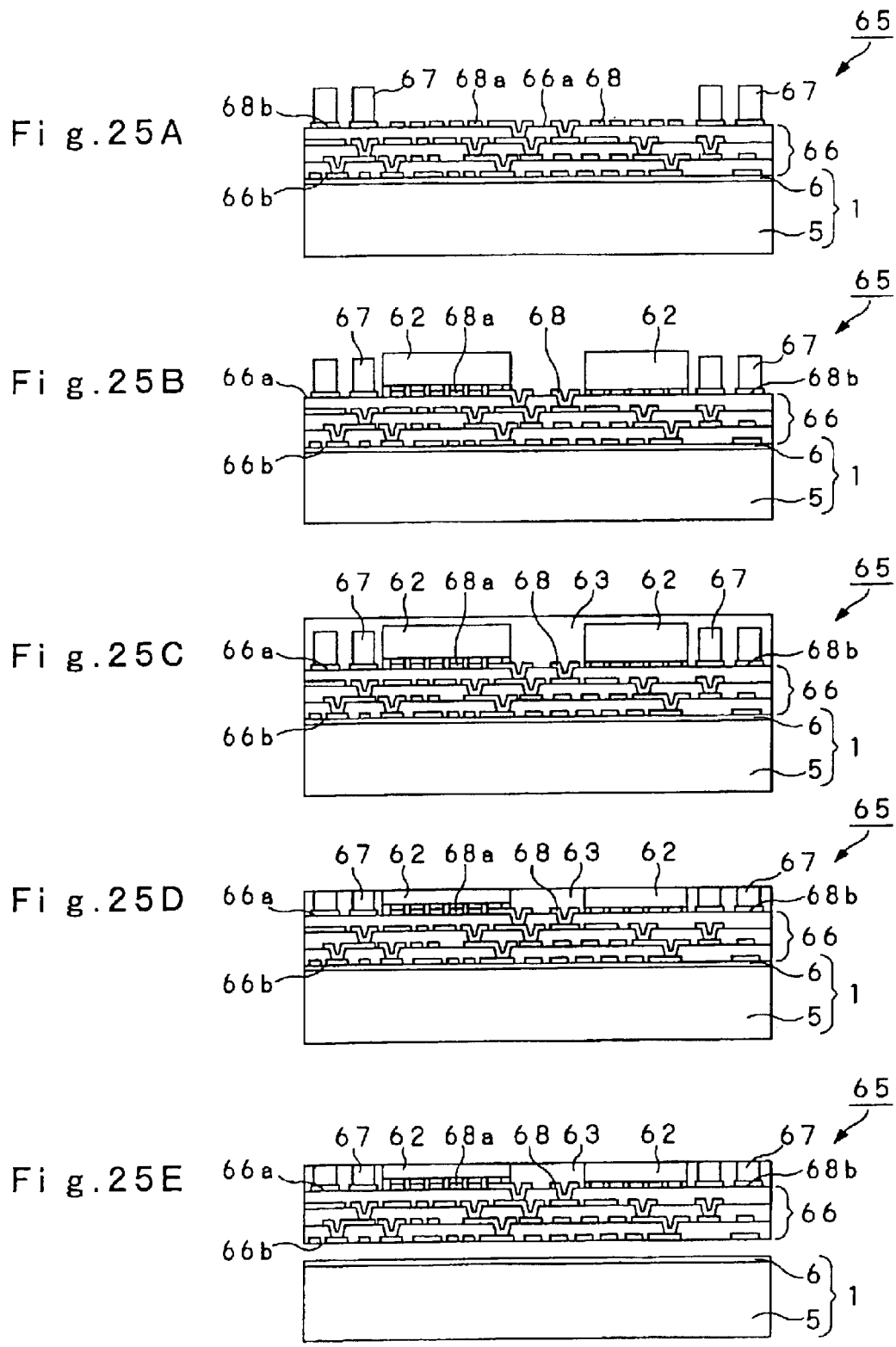
FIGS. 25A to 25E are axial sectional views showing the processes of producing the semiconductor module according to the present invention.

In the above semiconductor module 65, the external-connection terminals 67 are formed on the mounting surface 66a for the semiconductor blocks 62 with the circuit block 66 being held on the mother substrate 1 through production processes shown in FIGS. 25A to 25E. The production processes for the semiconductor module 65 include a one in which the external-connection terminals 67 are formed as in FIG. 25A, a following one in which the semiconductor chips 62 are mounted as in FIG. 25B, a further one in which the sealing resin layer 63 is formed as shown in FIG. 25C (as in the procedure for producing the semiconductor module 60), another one in which the sealing resin layer 63 is polished as shown in FIG. 25D, and still another one in which the circuit block 66 is released or separated from the mother substrate 1 as shown in FIG. 25E. Thus, the semiconductor module 65 is produced.

In the circuit block 66 produced according to the present invention, electrode pads 68a on which the semiconductor chips 62 are to be mounted, and electrode forming pads 68b on which the external-connection terminals 67 are to be formed, are formed on the uppermost wiring layer 68 on which the semiconductor chip mounting surface 66a is formed. In the circuit block 66, a first wiring layer 66b of the circuit block 66, facing the mother substrate 1, provides a surface at which the semiconductor module 65 is to be released from the mother substrate 1 and mounted on a base circuit board.

In the external-connection terminal forming process as in FIG. 25A, the external-connection terminals 67 are formed from metal convexities plated or solder balls formed, on the electrode forming pads 68b on the uppermost wiring layer 68. In the plating process, a plating resist is applied to the uppermost wiring layer 68 of the circuit block 66 by an appropriate technique, the plating resist is removed correspondingly to the electrode forming pads 68b which provide the external-connection terminals 67, and the electrode forming pads 68b are plated with electrolytic copper to form metal convexities each having a predetermined thickness. The solder balls are formed on the electrode forming pads 68b by feeding the mother substrate 1 having the circuit block 66 formed thereon into a reflow bath, for example.

Since the external-connection terminals 67 are formed on the circuit block 66 having been formed with a high precision through the aforementioned processes, they can be structured with a high precision, narrow-pitched and compact. They are formed somewhat thicker than the semiconductor chips 62 which are to be mounted on the circuit block 66 in the later process and polished. It should be noted that in case the semiconductor chips 62 are polished at the surface thereof for a reduced thickness of the semiconductor module 65, the external-connection terminals 67 are shaped to have at least a little greater height than a thickness of the semiconductor chips 62 polished to a maximum extent.

The semiconductor chips 62 are mounted on the electrode pads 68a on the circuit block 66 in the similar manner as in the aforementioned production processes. The sealing resin layer 63 is formed on the surface of the circuit block 66 on which the semiconductor chips 62 are mounted and the external-connection terminals 67 are formed. This sealing resin layer 63 is polished so that the external-connection terminals 67 are exposed. In the polishing step, the semiconductor chips 62 are also polished at the surface thereof to form a thinner semiconductor module 65. Also, in the polishing step, even any small and multiple external-connection terminals 67 thus formed will be prevented from being deformed, damaged or separated from the electrode forming pads 68b because the sealing resin layer 63 and semiconductor chips 62 are polished while the external-connection terminals 67 are being sealed along their periphery and thus mechanically supported.

Thereafter, in the separating step, the semiconductor module 65 is separated from the mother substrate 1. In the semiconductor module 65, the surface thereof at which is to be separated from the mother substrate 1 is also the surface 66b at which it is to be bonded to the base circuit board 64, and the solder balls or the like are formed on the first wiring layer as a connection terminal. In this semiconductor module 65, multiple external-connection terminals 67 are also formed on the surface where the semiconductor chips 62 are mounted. In the semiconductor module 65, appropriate surface-mounted type electronic parts, other semiconductor packages or the like can be mounted on the mounting surface for the semiconductor chips 62 on contact with the external-connection terminals 67.

Figure 26:
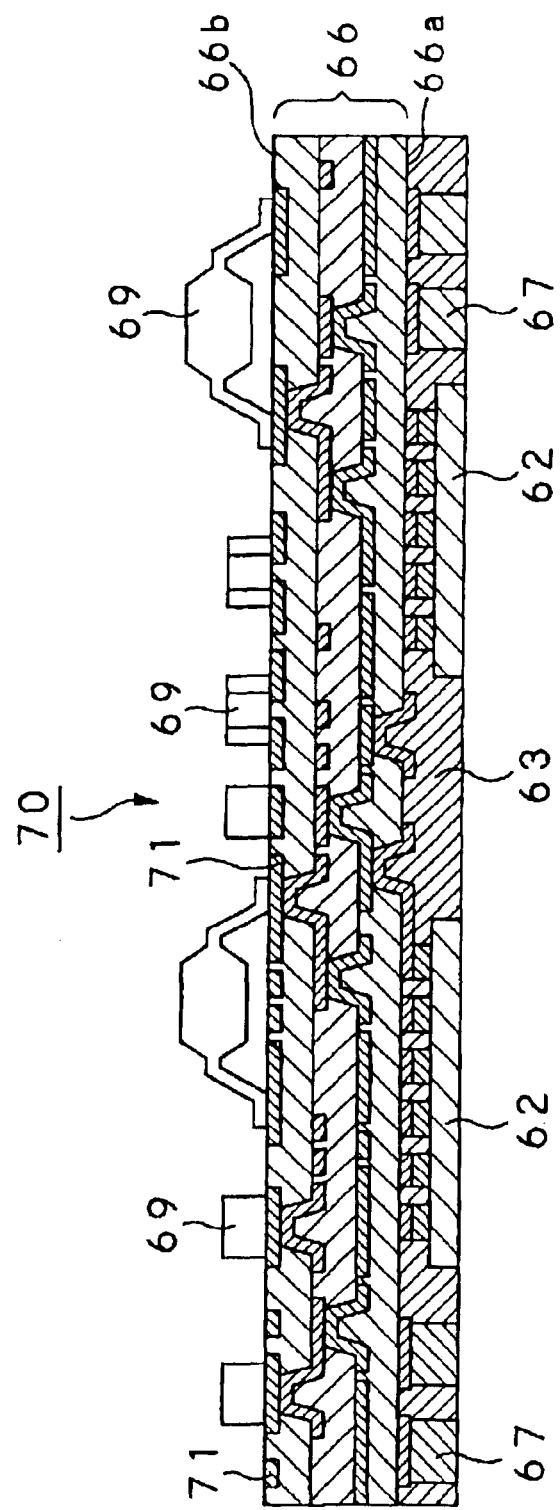
FIG. 26 is an axial sectional view of the semiconductor module having surface-mounted type parts installed on the side thereof where semiconductor chips are to be mounted.

As mentioned above, the bonding surface 66b of the circuit block 66 in the semiconductor module 65 is bonded to the base circuit board 64 to form the semiconductor device. As shown in FIG. 26 for example, however, a semiconductor module 70 having surface-mounted type parts 69 mounted thereon may be built according to the present invention. The surface-mounted type parts 69 include passive components such as a chip resistor, chip capacitor, etc. or semiconductor packages, and they are mounted by the solder reflow technique or the like. In this case, a first wiring layer 71 of the circuit block 66 in the semiconductor module 70 is formed as lands or connection circuit pattern on which the surface-mounted type parts 69 are to be mounted, instead of the connection terminals to be bonded to the base circuit board. In the semiconductor module 70, the circuit block 66 is formed with a high precision through the aforementioned processes, and thus the lands or connection circuit pattern are formed on the first wiring layer 71 at a small pitch and with a high precision.

In the above semiconductor module 70 according to the present invention, various surface-mounted type parts 69 are mounted on the first wiring layer 71 at a high density and with a high precision. Also, by mounting the above various surface-mounted type parts 69 on the first wiring layer 71 as above, it is possible to form a peripheral circuit for each of the semiconductor chips 62 within the same package of the semiconductor module 70. Thus, the length of wiring and number of connections can be reduced to minimize the L, C and R components in the circuits, to thereby provide a highly functional and high-performance semiconductor module 70.

Figure 27:
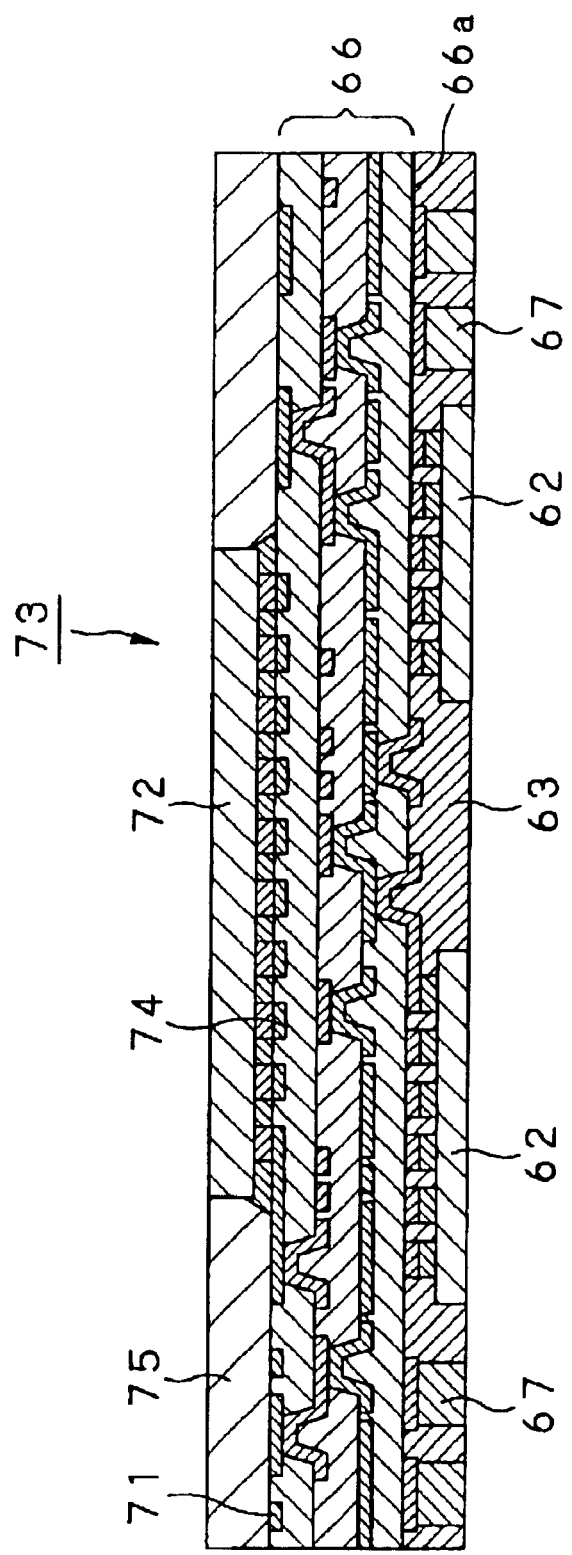
FIG. 27 is an axial sectional view of the semiconductor module having semiconductor chips mounted on either side thereof.
Figure 29:
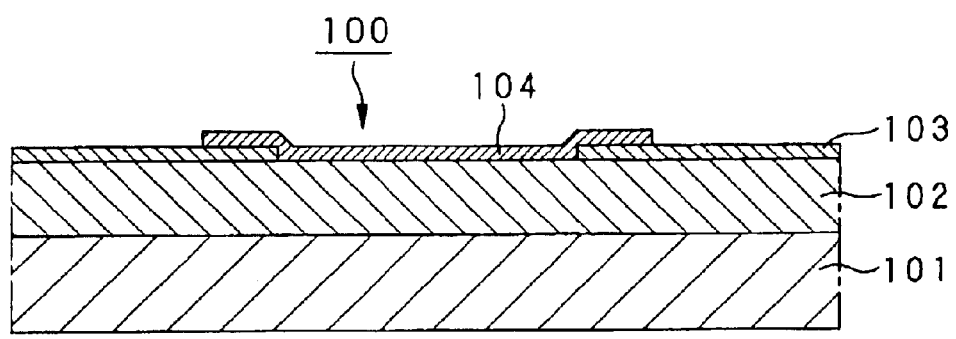
FIG. 29 is an axial sectional view of a wiring board having thin-film resistor formed thereon.
Figure 30:
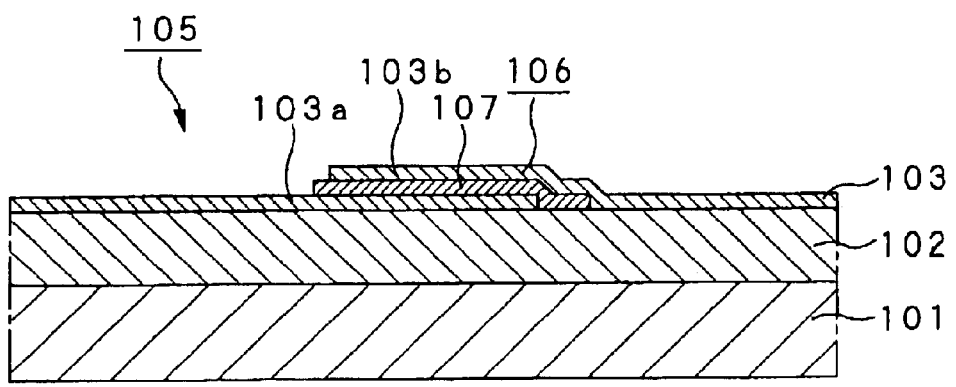
FIG. 30 is an axial sectional view of the wiring board shown in FIG. 29 and having a thin-film capacitor additionally formed thereon.
Figure 31:
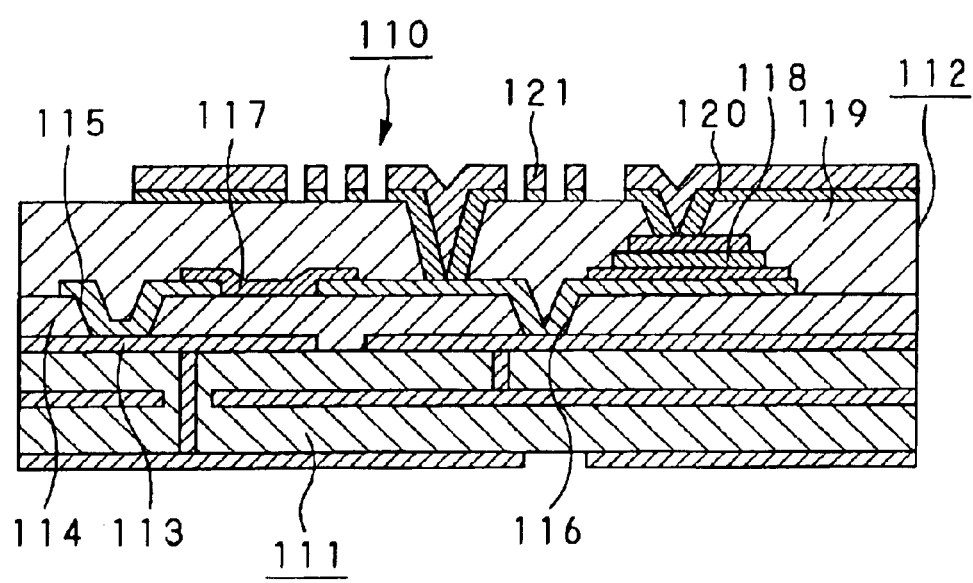
FIG. 31 is an axial sectional view of a conventional RF module.
Figure 32:
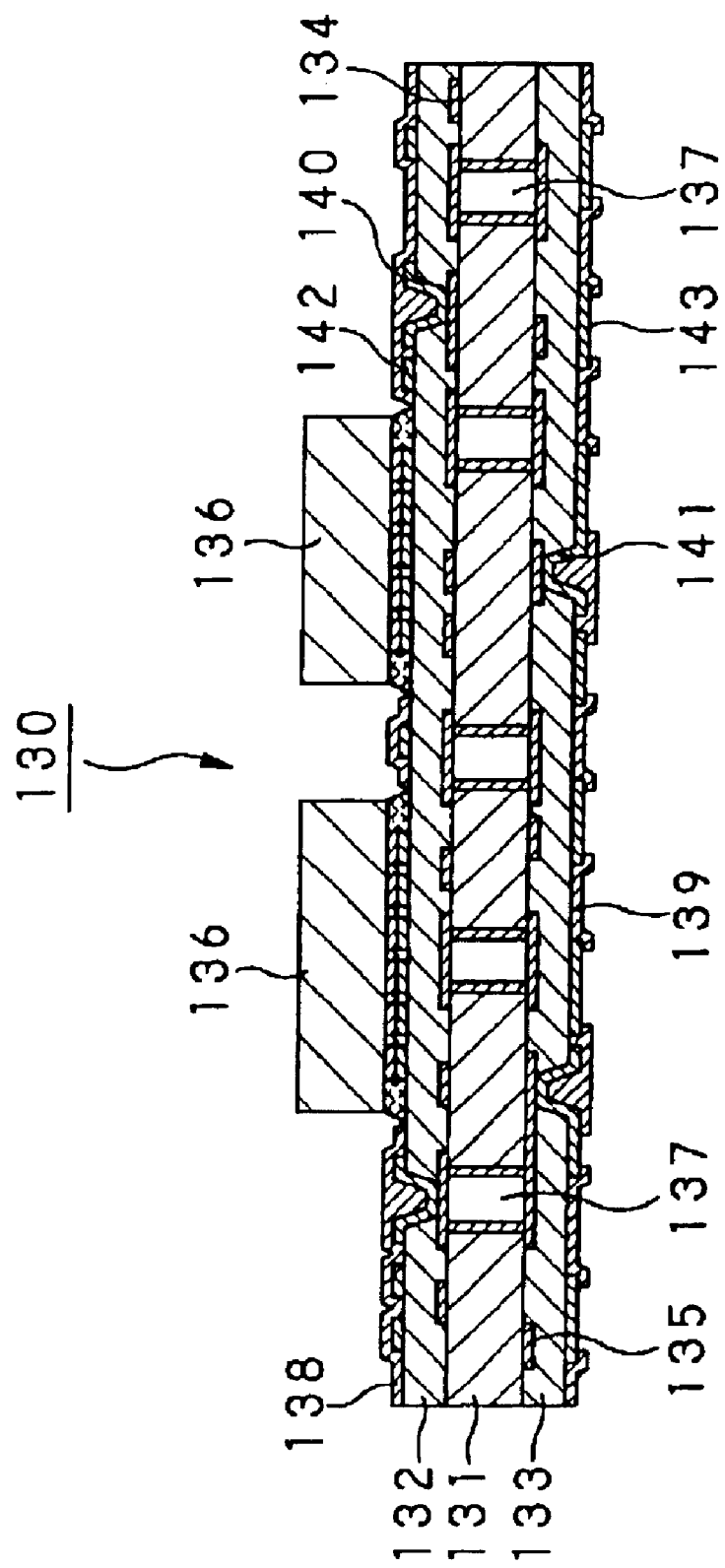
FIG. 32 is an axial sectional view of a conventional semiconductor device.

Second semiconductor chips 72 may be mounted on the bonding surface 66b of the circuit block 66, for example, in the above semiconductor module 65 to provide a semiconductor module 73 as shown in FIG. 27. In this semiconductor module 73, the first wiring layer 71 of the circuit block 66 is formed as connection lands 74 or connection circuit pattern on which the surface-mounted type parts 69 are to be mounted, in place of the connection terminals to be bonded to the base circuit board on which the semiconductor chip 72 is to be mounted. Namely, the semiconductor module 73 provides a multilayer semiconductor device in which the first group of semiconductor chips 62 and second group of semiconductor chips 72 are mounted three-dimensionally on the front and rear sides, respectively, of the circuit block 66.

The semiconductor module 73 is produced through processes including placing, on a flat base, the semiconductor module 65 separated from the mother substrate 1 as above with the first wiring layer 71 as the release surface upside, mounting the second group of semiconductor chips 72 on the first wiring layer 71 as a bonding surface in this step, forming a sealing resin layer and polishing the sealing resin layer and semiconductor chips 72. More specifically, in the semiconductor chip mounting step, the semiconductor chips 72 are mounted on the first wiring layer 71 of the circuit block 66. That is, the semiconductor chips 72 are mounted on lands 74 formed on the first wiring layer 71 of the circuit block 66 in the semiconductor module 65 as shown in FIG. 28A.

In the sealing resin layer forming step, a sealing resin layer 75 is formed to seal the mounted semiconductor chips 72 as shown in FIG. 28B. This sealing resin layer forming step is followed by a polishing step in which the sealing resin layer 75 and semiconductor chips 72 are simultaneously polished r at the surfaces thereof to reduce the thickness of the entire semiconductor module 73. Since the semiconductor chips 72 are mechanically protected by the sealing resin layer 75 formed along their periphery, they can be polished to a maximum extent without occurrence of any damage such as edge fracture to the semiconductor chips 72 even if they are subjected to a mechanical polishing.

The semiconductor module 73 produced through the above-mentioned processes has the abovementioned external-connection terminals 67 formed on the side thereof on which the first group of semiconductor chips 62 is mounted, and it is mounted on a base circuit board or the like on contact with these external-connection terminals 67 to provide a multilayer semiconductor device. Through the aforementioned processes, the external-connection terminals 67 may be formed on the side of the semiconductor module 73 on which the second group of semiconductor chips 72 is mounted, for example. The semiconductor module 73 thus constructed can be mounted, at the abovementioned chip-mounting side thereof as a bonding surface, on a base circuit board.

Industrial Applicability

According to the present invention, a mother substrate, having high-precision planarized surfaces and an excellent resistance against the surface temperature elevated when forming a thin film, capable of well keeping a focal depth during lithography and showing a good contact alignment during masking, and having a high performance of insulation and a high thermal or chemical resistance, is used to produce a high-precision, highly reliable circuit block having fine wiring patterns without being influenced by any warping and surface irregularities of the substrate. The method according to the present invention can be used to produce a thin circuit block having high-precision deposited components built in the circuit block and capable of mounting semiconductor chips, electronic parts, etc. with a high density.

According to the present invention, the circuit block separated from the mother substrate can be bonded to a base circuit board to efficiently produce a high-precision thin wiring circuit device in which the circuit block is supplied with a power and signals from the base circuit board.

Since the circuit block can easily be mounted directly on the base circuit board and the circuit block and base circuit board are electromagnetically isolated from each other to prevent an electromagnetic interference from taking place between them, so the wiring circuit device according to the present invention has improved characteristics. Also, since power and ground lines having sufficient areas can be formed on the base circuit board, a power can be supplied to the wiring circuit board with a high regulation.

Also, since multiple semiconductor chips are mounted in a simple manner on the circuit block having high-precision, fine wiring patterns, a high-precision, multifunctional, small semiconductor device can be produced efficiently. According to the present invention, since the semiconductor chips can be polished at the surfaces thereof without occurrence of any fracture or damage to the chips and mounted on the thin circuit block, so the thickness of the entire circuit block can be reduced and semiconductor chips and electronic parts can be mounted with a high density.

Further, in the semiconductor device produced according to the present invention, the circuit block having semiconductor chips mounted thereon and the base circuit board are electromagnetically isolated from each other to prevent any electromagnetic interference from taking place between them. So the semiconductor device has improved characteristics. Also, since power and ground lines having sufficient areas can be formed on the base circuit board, a power can be supplied to the semiconductor device with a high regulation.

What is claimed is:

1. A sheet-like circuit block comprising:

a patterned insulating layer;

a wiring layer formed in the patterned insulating layer, the wiring layer having semiconductor chips mounted thereon and also a sealing resin layer formed thereon to seal the semiconductor chips, the sealing resin layer being polished at the surface thereof so that projecting electrodes and semiconductor chips are exposed;

the wiring layer having formed thereon an electrode pattern and a plurality of projecting electrodes formed from a metal layer; a plurality of external-connecting lands formed on the wiring layer; and the circuit block thus constructed being formed on a release layer formed on a planarized principal surface of a mother substrate and at which it is separated from the mother substrate.

2. A sheet-like circuit block comprising:

a patterned insulating layer;

a wiring layer formed in the patterned insulating layer, the wiring layer having semiconductor chips mounted thereon, an electrode pattern formed thereon, a plurality of projecting electrodes formed from a metal layer with a metal ball terminal provided on each of the exposed projecting electrodes, and a sealing resin layer formed thereon to seal the semiconductor chips, the sealing resin layer being polished at the surface thereof so that the projecting electrodes and semiconductor chips are exposed;

a plurality of external-connecting lands formed on the wiring layer; and the circuit block thus constructed being formed on a release layer formed on a planarized principal surface of a mother substrate and at which it is separated from the mother substrate.

3. A circuit block producing method comprising steps of:
forming a dummy layer on the principal surface of the mother substrate;
forming a release layer on a planarized principal surface of a mother substrate;
forming an insulating layer on the release layer;
patterning, on the insulating layer, a wiring layer having a plurality of external-connection lands;
separating, from the release layer on the mother substrate, a thin circuit block consisting of the insulating layer and wiring layer;
a series of the circuit blocks being continuously formed on the principal surface of the mother substrate; and
the series of the circuit blocks on the mother substrate is cut into each of the circuit blocks, and each circuit block is separated from the release layer, wherein a cutter that is used to cut off each of the circuit blocks is controlled to stop in the dummy layer for the cutter edge not to reach the principal surface of the mother substrate.

4. A circuit block producing method comprising steps of:
forming a release layer on a planarized principal surface of a mother substrate;
forming an insulating layer on the release layer;
forming projecting electrodes of a metal on an electrode pattern formed on the uppermost wiring layer;
mounting semiconductor chips;
forming a sealing resin layer to seal the projecting electrodes and semiconductor chips;
polishing the sealing resin layer so that the projecting electrodes and semiconductor chips are exposed;
patterning, on the insulating layer, a wiring layer having a plurality of external-connection lands; and
separating, from the release layer on the mother substrate, a thin circuit block consisting of the insulating layer and wiring layer.

5. A wiring circuit device comprising:
a circuit block;
a base circuit board having a plurality of connection lands formed on a principal surface thereon correspondingly to external-connection lands formed on the circuit block;
the circuit block being shaped as a sheet including:
an insulating layer;
a wiring layer patterned on the insulating layer; and
the plurality of external-connection lands formed on the wiring layer;
the circuit block being formed on a release layer formed on a planarized principal surface of a mother substrate;
the circuit block being separated from the release layer on the mother substrate; and
the circuit block being bonded to the principal surface of the base circuit board with the external-connection lands formed on the wiring layer being connected to the corresponding connection lands formed on the base circuit board, a post bump being formed on each of the connection lands;
an adhesive layer of a thermoplastic resin is applied on the principal surface of the base circuit board to cover the post bumps; and
the post bumps penetrate through the adhesive layer and are connected to their corresponding connection lands when making thermo compression bonding of the circuit block with the circuit block being superposed on the base circuit board, and thus the circuit board is bonded to the base circuit board.

6. A wiring circuit device producing method comprising steps of:
forming a circuit block on a mother substrate; and
mounting, by bonding, the circuit block on a principal surface of a base circuit board;
the circuit block forming step further including steps of:
forming a release layer on a planarized principal surface of a mother substrate;
forming an insulating layer on the release layer;
patterning, on the insulating layer, a wiring layer with a plurality of external-connection lands;
forming a post bump on each of the connection lands on the wiring layer;
separating, from the release layer on the mother substrate, a thin circuit block consisting of the insulating layer and wiring layer;
bonding the circuit block by thermo compression bonding to the base circuit board having an adhesive layer of thermoplastic resin with the circuit block being superposed on the base circuit board;
the post bumps penetrate through the adhesive layer and abut on the external-connection lands, and thus are connected to the connection lands formed on the base circuit board.

7. A wiring circuit device producing method comprising steps of:
forming a circuit block on a mother substrate; and
mounting, by bonding, the circuit block on a principal surface of a base circuit board;
the circuit block forming step further including steps of:
forming a dummy layer on the principal surface of the mother substrate;
forming a release layer on a planarized principal surface of a mother substrate;
forming an insulating layer on the release layer;
patterning, on the insulating layer, a wiring layer with a plurality of external-connection lands; and
separating, from the release layer on the mother substrate, a thin circuit block consisting of the insulating layer and wiring layer;
wherein:
a series of the circuit blocks is continuously formed on the principal surface of the mother substrate; and
the series of the circuit blocks on the mother substrate is cut into each of the circuit blocks and each circuit block is separated from the release layer wherein, a cutter that is used to cut off each of the circuit blocks is controlled to stop in the dummy layer for the cutter edge not to reach the principal surface of the mother substrate.

8. A semiconductor device comprising:
a circuit block shaped in the form of a sheet;
semiconductor chips mounted on a wiring layer of the circuit block and a sealing resin layer which seals the semiconductor chips; and
a base circuit board having formed on a principal surface thereof a plurality of connection lands corresponding to external-connection lands of the circuit block;
the circuit block including:
an insulating layer;
a wiring layer patterned on the insulating layer; and the plurality of external-connection lands formed on the wiring layer;

wherein:

a post bump is formed on each of the connection lands;

an adhesive layer of a thermoplastic resin is applied on the principal surface of the base circuit board to cover the post bumps; and the post bumps penetrate through the adhesive layer and are connected to their corresponding connection lands when making thermo compression bonding of the circuit block with the circuit block being superposed on the base circuit board, and thus the circuit board is bonded to the base circuit board.

9. A semiconductor device comprising:

a circuit block shaped in the form of a sheet;

semiconductor chips mounted on a wiring layer of the circuit block and a sealing resin layer which seals the semiconductor chips;

a base circuit board having formed on a principal surface thereof a plurality of connection lands corresponding to external-connection lands of the circuit block;

the circuit block including:
an insulating layer;
a wiring layer patterned on the insulating layer; and
the plurality of external-connection lands formed on the wiring layer;

wherein:

the wiring layer has formed thereon an electrode pattern and a plurality of projecting electrodes formed from a metal layer; and the sealing resin layer is polished at the surface thereof so that the projecting electrodes and semiconductor chips are exposed.

10. A semiconductor device comprising:

a circuit block shaped in the form of a sheet;

semiconductor chips mounted on a wiring layer of the circuit block and a sealing resin layer which seals the semiconductor chips;

a base circuit board having formed on a principal surface thereof a plurality of connection lands corresponding to external-connection lands of the circuit block;

the circuit block including:
an insulating layer;
a wiring layer patterned on the insulating layer; and
the plurality of external-connection lands formed on the wiring layer;

wherein:

the wiring layer has formed thereon an electrode pattern and a plurality of projecting electrodes formed from a metal layer, a metal ball terminal being formed on each of the exposed projecting electrodes; and the sealing resin layer is polished at the surface thereof so that the projecting electrodes and semiconductor chips are exposed.

11. A semiconductor device comprising:

a circuit block shaped in the form of a sheet;

semiconductor chips mounted on a wiring layer of the circuit block and a sealing resin layer which seals the semiconductor chips, the semiconductor chips and sealing resin layer being polished to have a reduced thickness;

a base circuit board having formed on a principal surface thereof a plurality of connection lands corresponding to external-connection lands of the circuit block;

the circuit block including:
an insulating layer;
a wiring layer patterned on the insulating layer; and
the plurality of external-connection lands formed on the wiring layer;

wherein:

a post bump is formed on each of the connection lands;

an adhesive layer of a thermoplastic resin is applied on the principal surface of the base circuit board to cover the post bumps; and the post bumps penetrate through the adhesive layer and are connected to their corresponding connection lands when making thermo compression bonding of the circuit block with the circuit block being superposed on the base circuit board, and thus the circuit board is bonded to the base circuit board.

12. A semiconductor device producing method comprising steps of:

forming a thin circuit block on a mother substrate by the steps of:
forming the release layer on a planarized principal surface of the mother substrate;
forming an insulating layer on the release layer; and
patterning, on the insulating layer, the wiring layer having a plurality of external-connection lands;

forming a post bump on each of the connection lands on the wiring layer;

mounting semiconductor chips on the circuit block;

forming, on a wiring layer of the circuit block, a sealing resin layer which seals the semiconductor chips;

separating the circuit block having the semiconductor chips mounted thereon from a release layer formed on the mother substrate;

mounting, by bonding, the circuit block on a principal surface of a base circuit board; and bonding the circuit block by thermo compression bonding to the base circuit board having an adhesive layer of thermoplastic resin with the circuit block being superposed on the base circuit board;

wherein the post bumps penetrate through the adhesive layer and abut on the external-connection lands, and thus are connected to the connection lands formed on the base circuit board.

13. A semiconductor device producing method comprising steps of:

forming a thin circuit block on a mother substrate;

mounting semiconductor chips on the circuit block;

forming, on a wiring layer of the circuit block, a sealing resin layer which seals the semiconductor chips;

separating the circuit block having the semiconductor chips mounted thereon from a release layer formed on the mother substrate;

mounting, by bonding, the circuit block on a principal surface of a base circuit board; and the circuit block forming step including steps of:
forming a dummy layer on the principal surface of the mother substrate;
forming the release layer on a planarized principal surface of the mother substrate;
forming an insulating layer on the release layer; and
patterning, on the insulating layer, the wiring layer having a plurality of external-connection lands;

wherein:

a series of the circuit blocks is continuously formed on the principal surface of the mother substrate; and the series of the circuit blocks on the mother substrate is cut into each of the circuit blocks, and each circuit block is separated from the release layer, wherein a cutter that is used to cut off each of the circuit blocks is controlled to stop in the dummy layer for the cutter edge not to reach the principal surface of the mother substrate.

14. A semiconductor device producing method comprising steps of:

forming a thin circuit block on a mother substrate;

mounting semiconductor chips on the circuit block;

forming, on a wiring layer of the circuit block, a sealing resin layer which seals the semiconductor chips;

separating the circuit block having the semiconductor chips mounted thereon from a release layer formed on the mother substrate;

mounting, by bonding, the circuit block on a principal surface of a base circuit board; and the circuit block forming step including steps of:
　forming the release layer on a planarized principal surface of the mother substrate;
　forming an insulating layer on the release layer; and
　patterning, on the insulating layer, the wiring layer having a plurality of external-connection lands;
　forming an electrode pattern and projecting electrodes of a metal on the wiring layer; and
　polishing the sealing resin layer at the surface thereof so that the projecting electrodes and semiconductor chips are exposed.

15. A semiconductor device producing method comprising steps of:

forming a thin circuit block on a mother substrate;

mounting semiconductor chips on the circuit block;

forming, on a wiring layer of the circuit block, a sealing resin layer which seals the semiconductor chips;

separating the circuit block having the semiconductor chips mounted thereon from a release layer formed on the mother substrate;

mounting, by bonding, the circuit block on a principal surface of a base circuit board; and the circuit block forming step comprising the steps of:
　forming the release layer on a planarized principal surface of the mother substrate;
　forming an insulating layer on the release layer; and
　patterning, on the insulating layer, the wiring layer having a plurality of external-connection lands;

forming an electrode pattern and projecting electrodes of a metal on the wiring layer; and polishing the sealing resin layer at the surface thereof so that the projecting electrodes and semiconductor chips are exposed;

wherein a metal ball terminal is provided on each of the exposed projecting electrodes.

* * * * *